(12) United States Patent
Kenna et al.

(10) Patent No.: US 9,700,968 B2
(45) Date of Patent: Jul. 11, 2017

(54) APPARATUS AND METHODS FOR PROCESSING EXFOLIATED GRAPHITE MATERIALS

(71) Applicants: John Kenna, Surrey (CA); Gregory James, Coquitlam (CA); Norman Chor, Vancouver (CA); Shoji Kanamori, Port Coquitlam (CA)

(72) Inventors: John Kenna, Surrey (CA); Gregory James, Coquitlam (CA); Norman Chor, Vancouver (CA); Shoji Kanamori, Port Coquitlam (CA)

(73) Assignee: Terrella Energy Systems Ltd., Mission (CA)

( * ) Notice: Subject to any disclaimer, the term of this patent is extended or adjusted under 35 U.S.C. 154(b) by 157 days.

(21) Appl. No.: 14/583,402

(22) Filed: Dec. 26, 2014

(65) Prior Publication Data

US 2015/0189792 A1 Jul. 2, 2015

Related U.S. Application Data

(60) Provisional application No. 61/921,042, filed on Dec. 26, 2013, provisional application No. 62/035,210, filed on Aug. 8, 2014.

(51) Int. Cl.
*H01L 23/373* (2006.01)
*H05K 7/20* (2006.01)
(Continued)

(52) U.S. Cl.
CPC ............... *B23P 15/26* (2013.01); *F28F 1/14* (2013.01); *F28F 3/02* (2013.01); *F28F 21/02* (2013.01);
(Continued)

(58) Field of Classification Search
CPC ....... H01L 23/34–23/4735; H05K 7/20–7/206; G06F 1/20–1/206
See application file for complete search history.

(56) References Cited

U.S. PATENT DOCUMENTS

| | | | |
|---|---|---|---|
| 3,404,061 A | 10/1968 | Shane et al. | |
| 3,494,382 A * | 2/1970 | Bochman | C01B 31/00 138/129 |

(Continued)

*Primary Examiner* — Robert J Hoffberg
(74) *Attorney, Agent, or Firm* — Corridor Law Group, P.C.

(57) ABSTRACT

Methods and apparatus for processing flexible graphite sheet material involve patterning the material, on at least one major surface, prior to further processing of the material such as densification, lamination, folding or shaping into three-dimensional structures. For densification and lamination, the patterning is selected to facilitate the removal of air from the flexible graphite sheet material during the densification and lamination process. For folding or shaping, the patterning is selected to render the graphite sheet material more flexible. In some embodiments, methods for increasing the through-plane conductivity of flexible graphite sheet material are employed. Integrated heat removal devices include sheets of graphite material that have been selectively patterned in different regions to impart desirable localized properties to the material prior to it being shaped or formed into an integrated heat removal device. Coatings and/or resin impregnation can also be used to impart desirable properties to the material or device.

19 Claims, 38 Drawing Sheets

(51) Int. Cl.
- B23P 15/26 (2006.01)
- H01L 23/367 (2006.01)
- H01L 21/48 (2006.01)
- F28F 3/02 (2006.01)
- F28F 21/02 (2006.01)
- F28F 1/14 (2006.01)

(52) U.S. Cl.
CPC ...... H01L 21/4871 (2013.01); H01L 23/3672 (2013.01); H01L 23/373 (2013.01); H05K 7/2039 (2013.01); *B23P 2700/10* (2013.01); *H01L 2924/0002* (2013.01); *Y10T 29/4935* (2015.01)

(56) References Cited

U.S. PATENT DOCUMENTS

| | | | |
|---|---|---|---|
| 5,149,518 A | 9/1992 | Mercuri et al. | |
| 5,834,337 A | 11/1998 | Unger et al. | |
| 5,928,807 A | 7/1999 | Elias | |
| 6,060,166 A | 5/2000 | Hoover et al. | |
| 6,432,336 B1* | 8/2002 | Mercuri | C04B 14/024 264/105 |
| 6,503,626 B1 | 1/2003 | Norley et al. | |
| 6,506,484 B1 | 1/2003 | Mercuri et al. | |
| 6,548,156 B2 | 4/2003 | Mercuri et al. | |
| 6,604,457 B2 | 8/2003 | Klug | |
| 6,613,252 B2* | 9/2003 | Norley | B29C 43/222 264/105 |
| 6,620,506 B2 | 9/2003 | Mercuri et al. | |
| 6,649,102 B2 | 11/2003 | Davis et al. | |
| 6,663,807 B2 | 12/2003 | Klug | |
| 6,673,284 B2 | 1/2004 | Mercuri et al. | |
| 6,673,289 B2* | 1/2004 | Reynolds, III | C04B 35/536 264/115 |
| 6,702,970 B2 | 3/2004 | Klug | |
| 6,706,400 B2* | 3/2004 | Mercuri | C04B 14/024 423/448 |
| 6,716,381 B2 | 4/2004 | Klug | |
| 6,746,771 B2 | 6/2004 | Ottinger et al. | |
| 6,749,010 B2 | 6/2004 | Getz et al. | |
| 6,797,091 B2 | 9/2004 | Lines et al. | |
| 6,818,165 B2 | 11/2004 | Gallagher | |
| 6,902,841 B2 | 6/2005 | Mercuri et al. | |
| 6,923,631 B2* | 8/2005 | Mercuri | C04B 14/022 425/335 |
| 7,108,917 B2 | 9/2006 | Klug | |
| 7,182,898 B2 | 2/2007 | Klug | |
| 7,186,309 B2 | 3/2007 | Mercuri et al. | |
| 7,232,601 B2* | 6/2007 | Mercuri | B32B 9/00 423/448 |
| 7,280,359 B2 | 10/2007 | Fujiwara et al. | |
| 7,341,781 B2* | 3/2008 | Klug | H01M 8/0213 264/109 |
| 7,420,810 B2* | 9/2008 | Reis | C09K 5/041 165/104.26 |
| 7,470,468 B2 | 12/2008 | Mercuri et al. | |
| 7,758,783 B2 | 7/2010 | Shi et al. | |
| 8,067,091 B2 | 11/2011 | Brunovska et al. | |
| 8,382,004 B2 | 2/2013 | Asmussen et al. | |
| 8,537,553 B2 | 9/2013 | Mohammed et al. | |
| 8,916,269 B2 | 12/2014 | Brunovska et al. | |
| 2002/0164483 A1 | 11/2002 | Mercuri et al. | |
| 2002/0168526 A1* | 11/2002 | Mercuri | B32B 18/00 428/408 |
| 2002/0197476 A1 | 12/2002 | Mercuri et al. | |
| 2003/0051797 A1 | 3/2003 | Lines et al. | |
| 2004/0072055 A1 | 4/2004 | Getz et al. | |
| 2004/0241397 A1* | 12/2004 | Klug | B32B 9/00 428/195.1 |
| 2005/0104243 A1 | 5/2005 | Mercuri et al. | |
| 2005/0189673 A1 | 9/2005 | Klug et al. | |
| 2005/0208165 A1* | 9/2005 | Mercuri | C04B 14/022 425/80.1 |
| 2006/0070720 A1 | 4/2006 | Capp et al. | |
| 2007/0053168 A1* | 3/2007 | Sayir | B32B 18/00 361/718 |
| 2007/0158050 A1 | 7/2007 | Norley et al. | |
| 2008/0160284 A1* | 7/2008 | Mercuri | C04B 14/024 428/304.4 |
| 2008/0186419 A1* | 8/2008 | Kim | H05K 7/20963 349/32 |
| 2009/0301697 A1 | 12/2009 | Hirose | |
| 2013/0099013 A1 | 4/2013 | Asmussen | F28F 13/18 237/69 |
| 2013/0242573 A1 | 9/2013 | Petrsoki | |
| 2014/0287239 A1* | 9/2014 | Scurati | B29C 65/4855 428/408 |
| 2015/0075762 A1* | 3/2015 | Narendra | C09K 5/14 165/185 |
| 2016/0079144 A1* | 3/2016 | Scurati | B29C 65/4855 438/113 |
| 2017/0006736 A1* | 1/2017 | Kenna | B23P 15/26 |

\* cited by examiner $\rho = 0.46$ g/cm³

$\rho = 1.02$ g/cm³

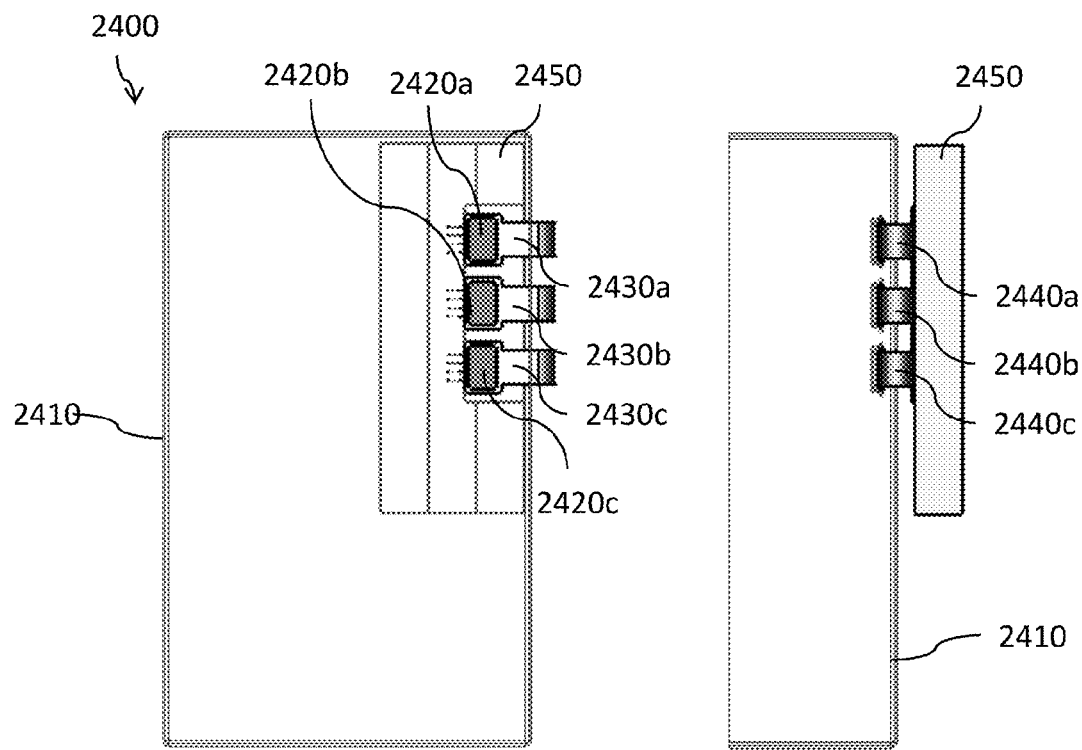
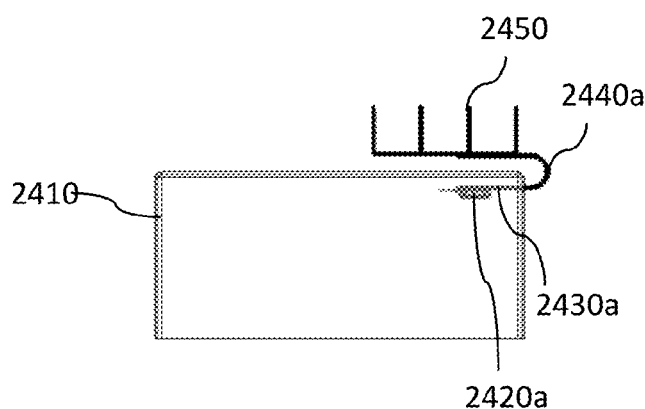
FIG. 24B  FIG. 24C
FIG. 24D

APPARATUS AND METHODS FOR PROCESSING EXFOLIATED GRAPHITE MATERIALS

CROSS-REFERENCE TO RELATED APPLICATIONS

This application claims priority benefits from U.S. provisional patent application No. 61/921,042 filed on Dec. 26, 2013, entitled "System and Method for Heat Dissipation Using Graphite Materials." This application also claims priority benefits from U.S. provisional patent application No. 62/035,210 filed on Aug. 8, 2014, entitled "Apparatus and Methods for Processing of Exfoliated Graphite Material". Each of the '042 and '210 applications is hereby incorporated by reference herein in its entirety.

FIELD OF THE INVENTION

The present invention relates to methods and apparatuses for processing exfoliated graphite material to modify or enhance its properties, in particular for use in thermal management applications. It also relates to integrated heat removal devices made from patterned graphite sheet material.

BACKGROUND OF THE INVENTION

Flexible graphite sheet material can be obtained by first intercalating graphite with an intercalating agent to form a graphite intercalation compound that is then exposed to a thermal shock, for example, at a temperature of 700° C.-1,050° C. for a short duration of time (20-60 seconds) to expand or exfoliate the graphite. The exfoliated graphite particles are vermiform in appearance, and are commonly referred to as "worms". The worm is essentially a network of interconnected, thin graphite flakes, with pores present between flakes that make the worms compressible. The worms can be re-compressed together into flexible sheets (foils or films), referred to as "flexible graphite" or "exfoliated graphite sheet" or "graphite sheet" that can be wound up on a drum to form a roll. U.S. Pat. No. 3,404,061 describes the preparation of flexible graphite from expanded or exfoliated graphite particles.

Most of the graphite flakes in flexible graphite are oriented parallel to the two opposed major exterior surfaces. Although flexible graphite is typically highly electrically conductive (typically around 1,300 S/cm) in the in-plane directions, flexible graphite's through-plane electrical conductivity is significantly less (often only about 15 S/cm). The anisotropy ratio, the ratio of highest electrical conductivity to lowest conductivity values, is typically as high as 86:1 (and often higher than this value). The thermal properties of flexible conventional flexible graphite are similarly highly anisotropic with the in-plane thermal conductivity being many times greater than the through-plane conductivity.

The properties of flexible graphite (such as its density, flexibility and its electrical and thermal conductivity) can be adjusted by incorporating a resin during forming of the material or impregnating it with a resin or another suitable impregnation medium after it is formed. The impregnation medium at least partially fills the pores between the graphite flakes. Resins suitable for impregnation of flexible graphite include phenolic, furan, epoxy and acrylic resins.

During compression or embossing processes, air can become trapped within the flexible graphite as it is compressed. This can cause problems including blistering and/or delamination of the embossed material. This is particularly undesirable for some end-use applications. For example, blistering or delamination in flexible graphite materials can weaken the material and make it more permeable to fluids. The material is also rendered less homogeneous as a result and can exhibit undesirable localized differences in thermal and electrical conductivity. The foregoing problems can be difficult to detect during fabrication and may only surface at a later date. Finally, in applications where the material is subsequently impregnated with a resin, delamination and/or blistering can result in voids in the plate material that become filled with resin. Where the resin employed is electrically nonconductive, this can result in undesirable nonconductive regions within the material.

For thermal management applications, such as heat sinks, heat spreaders and thermal interfaces, flexible graphite offers many advantages over other materials that are commonly used in these applications such as copper, steel and aluminum. For example, relative to these metals, flexible graphite is often lighter, less susceptible to corrosion, has lower thermal expansion and has higher thermal conductivity in the in-plane direction.

The present application relates to methods and apparatuses for processing of flexible graphite that can be used to modify or enhance its properties, in particular for use in thermal management applications.

SUMMARY OF THE INVENTION

Methods and apparatus for processing flexible graphite sheet material involve patterning the material, on at least one major surface thereof, prior to further processing of the material such as densification, lamination, folding or shaping into three-dimensional structures. For densification and lamination the patterning is selected to facilitate the removal of air from the flexible graphite sheet material during the densification and lamination process. For folding or shaping, the patterning is selected to render the graphite sheet material more flexible. Methods and apparatus for increasing the through-plane conductivity of flexible graphite sheet material are also provided.

In one aspect, a method of densifying flexible graphite sheet material includes:
(a) patterning the flexible graphite sheet material, on at least one major surface thereof, to produce patterned graphite sheet material; and
(b) compressing the patterned graphite sheet material to produce densified flexible graphite sheet material, wherein the patterning is selected to facilitate the removal of gas from the flexible graphite sheet material during the compression step.

In the foregoing method of densifying flexible graphite sheet material, the patterning step can comprise calendering the material with one or more patterned rollers or die pressing the material with one or more patterned dies or screens. The patterning can extend across the entire surface of the sheet material or can be in one or more localized regions. In some preferred embodiments, a subsequent compression step substantially removes the patterning. The compression step can involve, among other things, using substantially smooth or flat rollers or dies. In other embodiments, the compression step can have at least one embossing step using, among other things, patterned rollers, dies or screens. The foregoing methods can further include cutting the densified flexible graphite sheet material.

In one aspect, a method of laminating two pieces of flexible graphite sheet material together includes:

(a) patterning each piece of flexible graphite sheet material on at least one major surface thereof, to produce two pieces of patterned graphite sheet material;

(b) stacking the two pieces of patterned graphite sheet material so that patterned surfaces of each piece are adjacent to one other; and (c) compressing the stacked pieces of patterned graphite sheet material to laminate them together, wherein the patterning is selected to facilitate the removal of gas from the flexible graphite sheet material during lamination.

In the foregoing lamination method, the patterning step can include calendering the material with one or more patterned rollers or die pressing the material with, among other things, one or more patterned dies or screens. The patterning can extend across the entire surface of the sheet material or can be in one or more localized regions. In some embodiments, the lamination step can include calendering or die pressing the stacked pieces of patterned material. The foregoing methods can further include cutting the laminated flexible graphite sheet material.

In one aspect, a method of improving the flexibility of a sheet of a graphite sheet material together includes patterning the flexible graphite sheet material, on at least one major surface thereof, to produce patterned graphite sheet material, wherein the patterning is selected to reduce the tendency of the sheet material to splinter or crack when it is bent.

In the foregoing method for improving flexibility, the patterning step can include calendering the material with one or more patterned rollers or die pressing the material with, among other things, one or more patterned dies or screens. The patterning can extend across the entire surface of the sheet material or can be in one or more localized regions.

In the foregoing methods involving patterning flexible graphite sheet material prior to further processing thereof (for example, where the further processing comprises densification, lamination or bending), the patterning can include one or more patterning steps. In some embodiments, the patterning can include roller embossing of the flexible graphite sheet material and/or die pressing the flexible graphite sheet material with a patterned die.

In some embodiments of the foregoing methods, the patterning can include creating a cross-hatched diamond pattern on the at least one surface. This patterning can be performed by a first step patterning a first set of diagonal grooves and a second step patterning a second set of diagonal grooves in the flexible graphite sheet material. In some embodiments the second set of grooves is essentially orthogonal to the first set.

In one aspect, a method for decreasing thermal anisotropy in graphite sheet material includes:

(a) blending exfoliated graphite to form a powder; and (b) compacting the powder in a die cavity to produce densified graphite sheet material.

In the foregoing method, the exfoliated graphite can be blended using an industrial blender. The powder can be compacted using a punch.

The foregoing method for decreasing thermal anisotropy can further include:

(c) patterning the densified graphite sheet material during the compacting, wherein the patterning orients the graphite flakes so as to increase the through-plane thermal conductivity of the densified graphite sheet material. The patterning is selected to alter the orientation of graphite flakes within the densified graphite sheet material so that more of them are oriented perpendicular to the plane of the material.

Graphite sheet materials having decreasing thermal anisotropy that are made by these methods can be used as thermal interface materials.

In one aspect, a method for increasing the through-plane to in-plane thermal conductivity ratio of a graphite sheet material (for example, a conventional anisotropic sheet material prepared by calendering exfoliated graphite) includes patterning the flexible graphite sheet material, on at least one major surface thereof, to produce patterned graphite sheet material. The patterning is selected to alter the orientation of graphite flakes within the sheet material so that more of them are oriented perpendicular to the plane of the material.

The method for increasing the through-plane to in-plane thermal conductivity ratio of a graphite sheet material can further include compressing the patterned graphite sheet material to produce densified flexible graphite sheet material.

In the foregoing methods involving patterning graphite sheet material to increase the through-plane to in-plane thermal conductivity ratio of the material, the patterning can include one or more patterning steps. The patterning can include roller embossing of the graphite sheet material and/or creating a button pattern with an array of circular protrusions on one or both surfaces of the material.

Graphite sheet materials having an increased through-plane to in-plane thermal conductivity ratio that are made by these methods can be used as thermal interface materials.

Embodiments of the various methods described above can be implemented as continuous processes or as batch processes.

Various apparatuses and systems can carry out the above-described methods.

In one aspect, an improved heat sink assembly includes a first folded subassembly consisting essentially of a compressed formable graphite material. In a first embodiment, the first subassembly further includes a base configured to conform to an outer surface of a heat source. In some preferred embodiments, the first subassembly further includes a first fin and a second fin. The first and second fins are configured to extend away from the heat source when the first subassembly is attached to an outer surface of the heat source. In the same or other preferred embodiments, the outer surface of the first subassembly is configured to face away from the heat source and the outside face is embossed to form a plurality of ribs that run a length of the first subassembly.

In one aspect, an improved method of dissipating heat from a heat source includes conforming a heat sink assembly to an outer surface of the heat source, the heat sink assembly consisting essentially of a graphite sheet material.

As described above, graphite sheet material can be patterned in various ways in order to change its properties, including its ability to be densified, laminated, folded or shaped, as well as its in-plane and through-plane thermal and electrical conductivity, and its surface area.

In yet another aspect of the present technology, graphite sheet material is selectively patterned in different regions to impart desirable localized properties to the material. Separate dies can be used to pattern different regions of the material or a single die with multiple different features or patterns in different regions can be used.

An integrated flexible graphite heat removal device can be made from one or more pieces graphite sheet material that is selectively patterned in different ways in different regions to impart desirable localized properties to the device. In some embodiments the device is made from a single sheet of material. In other embodiments at least two pieces of patterned graphite sheet material are laminated together to form an integrated flexible graphite heat removal device.

In some embodiments an integrated heat removal device includes, or consists essentially of, a piece of graphite sheet material that is selectively patterned in at least one localized region with a pattern that enhances the through-plane thermal conductivity of the material. The piece of graphite sheet material can be further patterned in at least one localized region with a pattern that that renders the material more flexible and/or in at least one localized region with a pattern that increases the surface area to facilitate heat dissipation to the surrounding environment.

The integrated heat removal device is made by forming the selectively patterned graphite sheet material into a three-dimensional structure, for example, by bending, folding and/or corrugating.

In some embodiments graphite sheet material prepared using the above-described methods, or devices or components made therefrom, or portions thereof, are impregnated with a resin. In some embodiments graphite devices, such as integrated heat removal devices can be impregnated in one or more regions after they are formed or shaped.

In some embodiments graphite sheet material prepared using the above-described methods, or devices or components made therefrom, or portions thereof, are coated with a coating. In some embodiments graphite devices, such as integrated heat removal devices can be coated in one or more regions after they are formed or shaped. In some embodiments the coating is electrically insulating.

BRIEF DESCRIPTION OF DRAWINGS

FIG. 246B is a front view of the heat sink assembly of FIG. 24A.

FIG. 24C is a side view of the heat sink assembly of FIG. 24A.

FIG. 24D is a top plan view of the heat sink assembly of FIG. 24A.

DETAILED DESCRIPTION OF PREFERRED EMBODIMENT(S)

Prior Art

Figure 1:
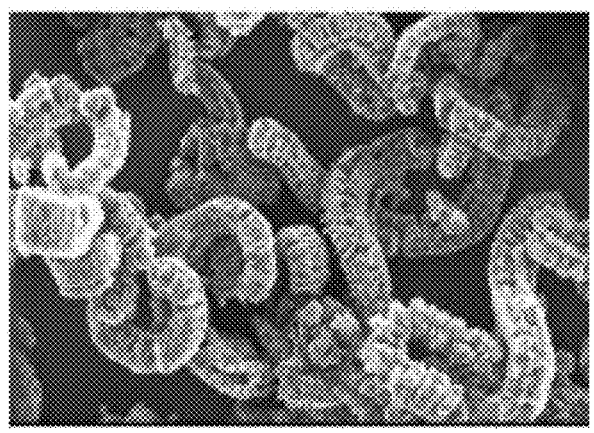
FIG. 1 is a scanning electron microscope image illustrating the structure of exfoliated graphite.

FIG. 1 is a scanning electron microscope image illustrating the structure of exfoliated graphite. Exfoliated graphite can be formed from graphite through a series of special furnaces and chemical processes. It can then be compressed to form a low density mat, or to form sheets of flexible graphite of higher density that can be supplied on a roll. For example a calendering process, where exfoliated graphite material is fed through a series of drums or rollers in a process that gradually brings the material to a desired thickness and density range, can be used for form flexible graphite. Calendering or compression forming steps can also be used emboss features on one or both surfaces of the flexible graphite sheet material that are suitable for its end-use application.

Figure 2A:
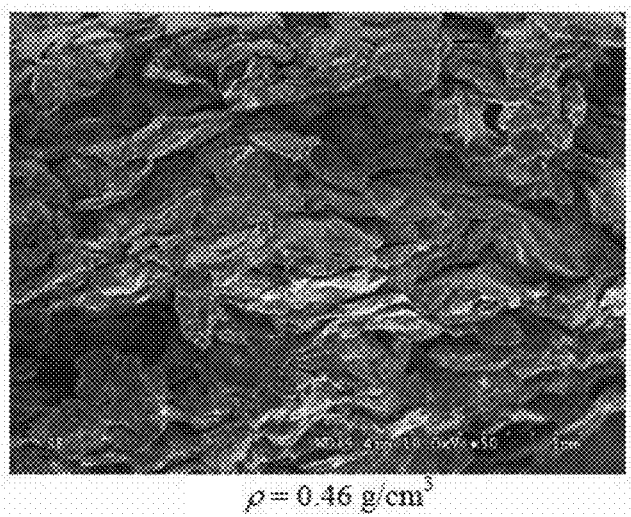
FIGS. 2A and 2B are scanning electron microscope images illustrating exfoliated graphite sheet of a lower density structure and a higher density structure, respectively.
Figure 2B:
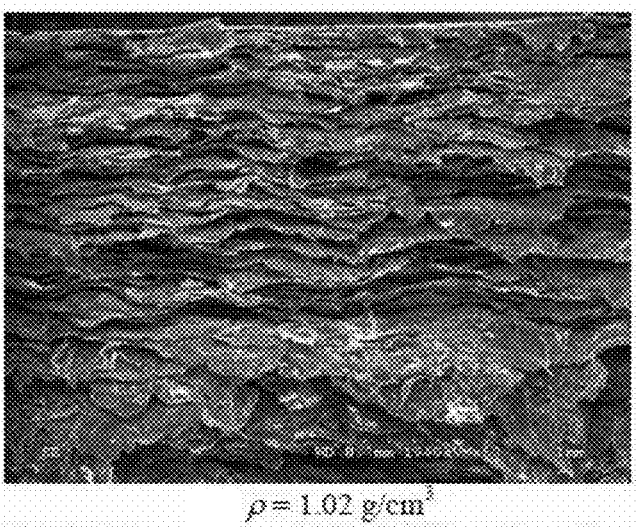

FIGS. 2A and 2B are scanning electron microscope images illustrating exfoliated graphite sheet (flexible graphite) of a lower density structure and a higher density structure, respectively. The lower density structure of FIG. 2A has a density of approximately 0.46 $g/cm^3$. The higher density structure of FIG. 2B has a density of approximately 1.02 $g/cm^3$. The higher density structure of FIG. 2B is illustrative of flexible graphite typically used in fuel cell applications. Despite its higher density, the structure of the flexible graphite in this example still contains pores or air pockets.

Existing methods to provide a higher density structure than the structure of FIG. 2B include extremely high-impact or high pressure compression. Such methods can be complex and be costly in terms of energy consumption.

A limitation of existing processes for producing flexible graphite sheets is that the graphite flakes can trap air pockets during compression, particularly in the mid-plane of the material, but also near the surface. The presence of air pockets can limit the degree to which the material can be densified by the process, and can cause blistering. Such air pockets can be difficult to avoid or reduce with conventional calendering or other compression processes. Techniques can be used to alleviate problems caused by air pockets, such as deploying vacuum air removal systems during compression, or impregnating the graphite with resin or another suitable medium after compression to fill the voids.

One problem with resin impregnation is that it can prevent, or at least reduce, fluid leakage or permeation if the material is to be used as a gasket, seal or impervious barrier. Furthermore, whether or not they are filled with resin, the pores or air pockets remaining inside the compressed sheet material result in non-uniformity in the structure and properties of the material that can make them less suitable for use in certain applications. Pores or air pockets can also make the material more susceptible to mechanical degradation and delamination or flaking of the layers.

Patterning for Improved Densification of Flexible Graphite

Apparatuses and methods for improved densification of sheet materials made using exfoliated graphite involve patterning the graphite sheet material prior to performing further processing steps that are used, for example, to form it into a material with a desired thickness and/or desired surface features, and/or to laminate it with other sheets. Such patterning can be selected to facilitate the removal of air from the material during subsequent processing steps. Thus, appropriate patterning prior to further processing of graphite sheet material can offer benefits including:

- increasing the density that can be achieved by subsequent compression of the material; and/or
- increasing the uniformity or homogeneity of the material that is obtained during subsequent compression of the material; and/or
- reducing the tendency for trapped air pockets, and associated blistering and delamination of the material; and/or
- providing more a homogenous or seamless joining of adjacent layers in laminated structures; and/or
- improving its thermal properties in the desired direction of heat flow.

Figure 3:
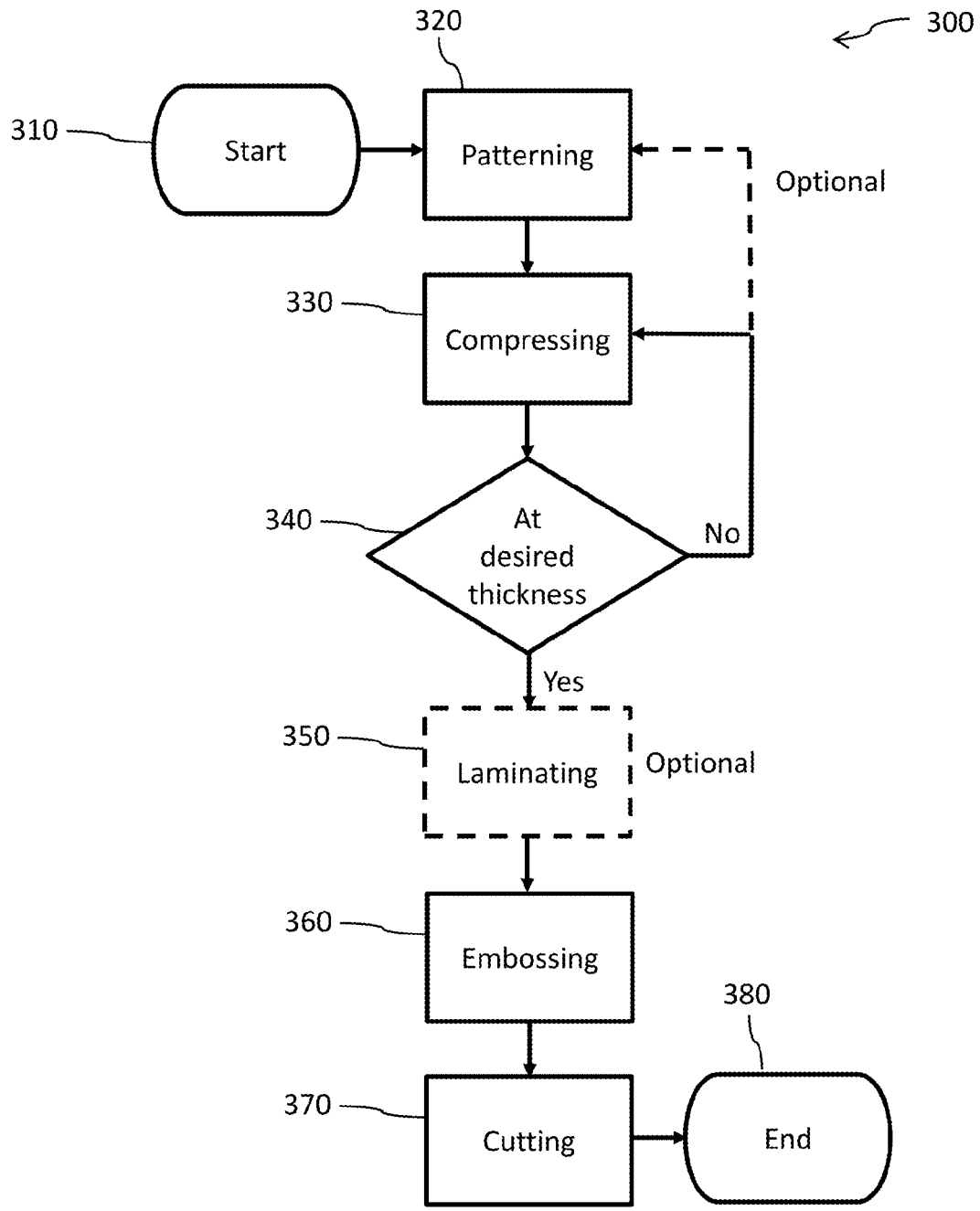
FIG. 3 is a flow chart illustrating an embodiment of a method for improved densification of flexible graphite.

FIG. 3 is a flow chart illustrating an embodiment of method 300 for improved densification of flexible graphite. Method 300 comprises steps 310 through 380. Method 300 begins at step 310. At step 320, graphite sheet material is patterned on one or both surfaces with a pattern that will facilitate air removal during subsequent processing of the material. This can be accomplished by creating an embossed pattern on one or both surfaces of flexible graphite sheet material, for example, using a patterned reciprocating platen press or die or a roll embossing system with a patterned drum, in a single or multi-step process. This patterning step generally removes some of the air and prepares the material for additional efficient air removal in a subsequent compression and/or embossing steps.

Various patterns can be used including, but not limited to, a cross-hatched diamond pattern, a cross-hatched square pattern, and an array of protrusions such as circular features or buttons. Patterning can be performed in one or more steps. In one embodiment, cross-hatched diamond patterning can be performed by a first step patterning a first set of diagonal grooves and a second step patterning a second set of diagonal grooves, where the second set of grooves can be at a non-orthogonal angle to the first set. Similarly a square-grid pattern can be obtained by patterning two sets of grooves at 90° to one another.

At step 330, the patterned graphite sheet material is compressed to increase its density. This can be accomplished, for example, in a platen press, die press or through a calendering process. Generally this step will significantly reduce or eliminate the initial patterning from the surface(s) of the graphite sheet material.

At step 340, the compressed graphite sheet material is tested to see if it is at the desired thickness (or density). If the material is not at a desired thickness, then method 300 returns to step 330 where it is compressed further, or (optionally) to step 320 where it is patterned and subsequently compressed further at step 330.

If the material is at the desired thickness, then method 300 proceeds to optional step 350 where two or more sheets from step 340 are laminated to form a single laminated graphite sheet. This can be accomplished by bringing the patterned surfaces of two or more sheets of graphite material adjacent to each other and compressing the laminate together. Lamination at step 350 is optional, and method 300 can proceed directly to step 360 from step 340 when the material is at a desired thickness.

At step 360, the compressed graphite sheet from step 340 or laminated graphite sheet from step 350 is embossed, for example to form surface features that are desirable for a particular end-use application. At step 370, the embossed graphite sheet is cut to a desired shape and size. Method 300 ends at step 380.

Although the present approach, involving patterning graphite sheet material to facilitate air removal, can be employed in a batch compression system (for example, involving a platen presses) it is particularly suitable for use in a multi-step calendering/embossing process as described in further detail below.

Figure 4:
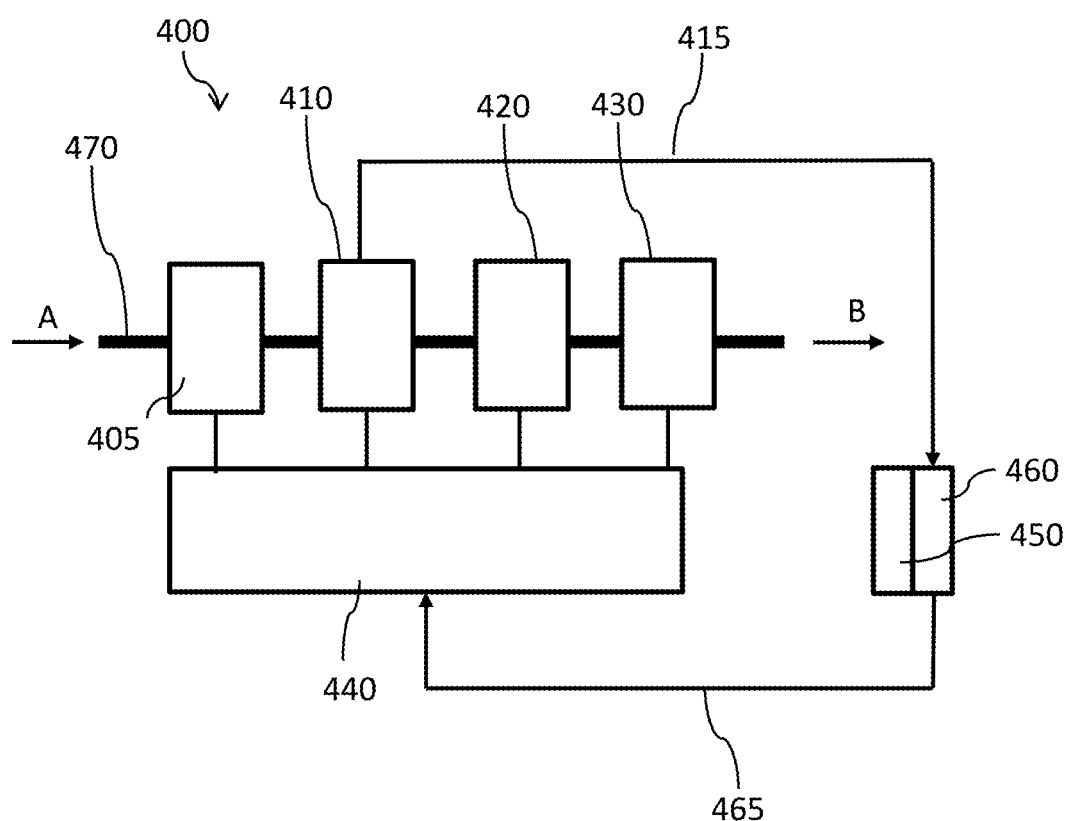
FIG. 4 is a block diagram of an apparatus for multi-step densification of flexible graphite.

FIG. 4 is a block diagram of apparatus 400 for graphite densification. FIG. 4 shows an example embodiment of a roll embossing apparatus that uses a calendering step to pattern the material prior to further calendering for densification and then final embossing.

Apparatus 400 comprises infeed and patterning station 405, densification station 410, embossing station 420, cutting station 430 and drive motor system 440. Drive motor system 440 provides the drive to rotate the calendering drums and drive other machinery in stations 405, 410, 420 and 430.

Graphite sheet material is fed into apparatus 400 at infeed and patterning station 405 using a conveyor 470, as indicated by arrow A. At station 410, the graphite sheet material is compressed and patterned on one or both sides using at least one pair of drums. Grooves or features are impressed onto the graphite sheet material, and the process pushes air out of the graphite material. Grooves or other features in the drum(s) can provide a path for the air to escape, thereby allowing the material to be compressed during patterning, without undue obstruction of air or hydraulic locking of trapped air between the graphite flakes.

The material is then conveyed to densification station 410 where it is further compressed to a desired thickness using at least one pair of drums. The desired thickness can be based on the amount of graphite per unit area in the material (loading) and the net desired thickness for the final embossed part. The compressed material is then conveyed to embossing station 420 where it can be embossed with surface features as desired for a particular end-use application, and then to cutting station 430 via conveyor 470. At cutting station 430, the material is cut to a desired shape and size, for example with a clicker-type press or with die cutters, cutting wheels, another embossing drum with cutters, or other suitable cutting mechanism. Material exits apparatus 400 after cutting station 430 on conveyor 470, as indicated by arrow B.

Embossing and cutting stations 420 and 430 are optional. In some embodiments, the material can be transferred from the embossing station 420 onto a reel, and the material can be cut to a desired shape and size at a later time. Furthermore, in some embodiments, embossing can be performed directly on the patterned graphite sheet material at densification station 410 rather than compressing the material (for example, to give a densified material that is substantially un-patterned) at station 410, and then embossing in a separate step at station 420.

Apparatus 400 further includes power supply 450 and at least one process controller 460. First data flow 415 provides monitoring and sensor feedback information from densification station 410 to the at least one process controller 460. Second data flow 465 provides data control and shuttle command information from the at least one process controller 460 to drive motor system 440.

Apparatus 400 can further comprise a mechanism for measuring overall material thickness at one or more stages in the process. The mechanism can use a laser or mechanical or other suitable instrumentation. The thickness measurement can be used to adjust various process parameters used for operation of patterning station 405, densification station 410 and/or embossing station 420, such as gaps, drum speeds and other parameters.

The material can be patterned, for example, with one or more sets of parallel channels. For example two sets of parallel channels can be used to create a square grid pattern or diamond pattern on the material, so that the surface has an array of square- or diamond shaped protrusions. In other examples the material is patterned with an array of small protrusions of other shapes, for example circular buttons or dots. In preferred embodiments the channels extend to the edges of the material so that air is expelled along the channels as the material is compressed. If the material is to be densified and/or laminated using one or more rollers it is preferable that the channels along which air is expelled extend at an angle (rather than being parallel and/or perpendicular) to the direction of movement of the material during roller compression.

Figure 5A:
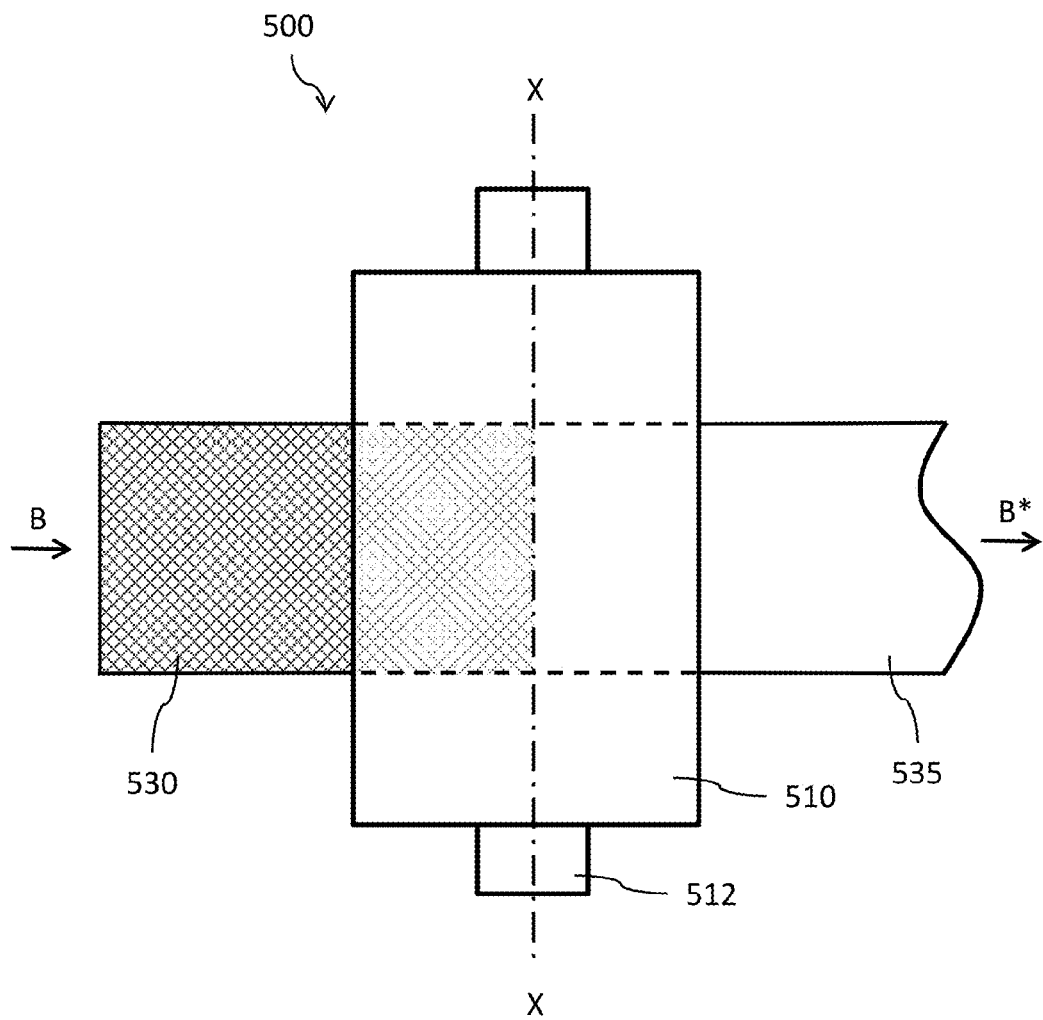
FIG. 5A is schematic plan view illustrating an example embodiment of an apparatus being used for the densification of flexible graphite that has been patterned to facilitate air removal.
Figure 5B:
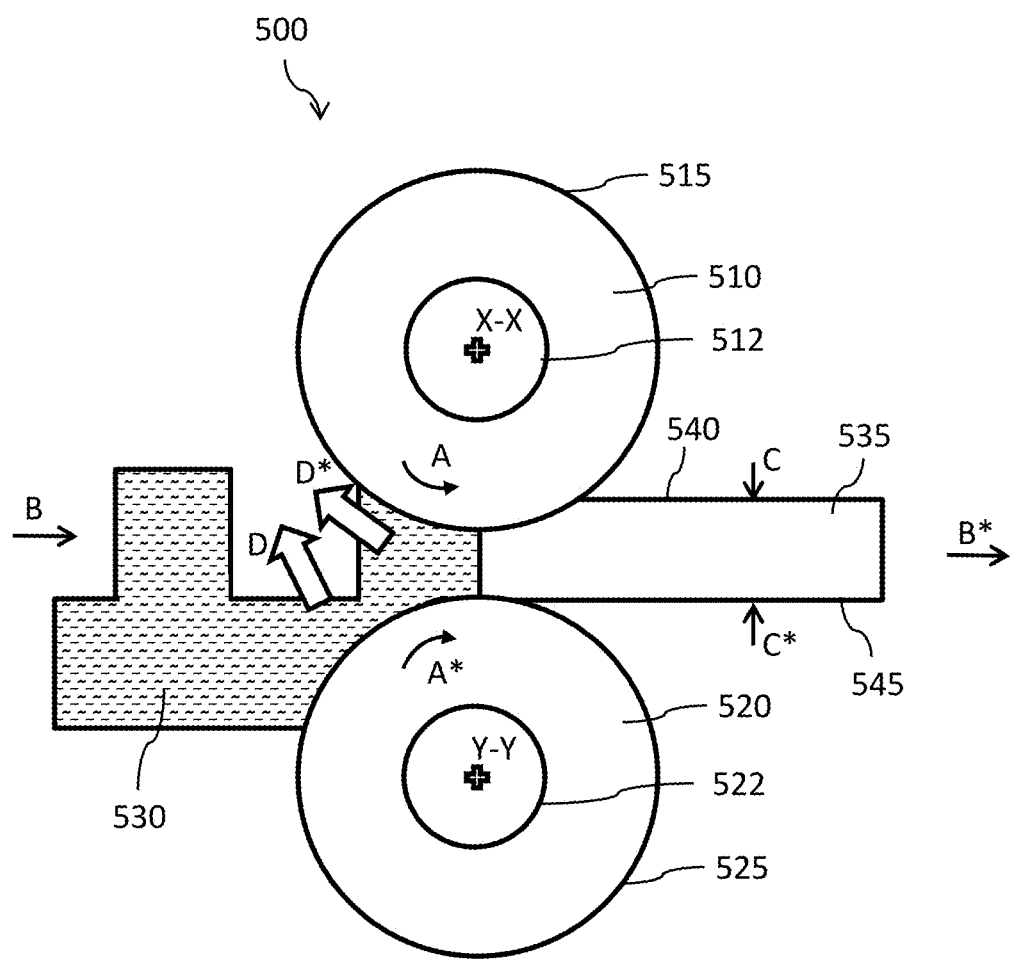
FIG. 5B is schematic side view of the apparatus illustrated in FIG. 5A being used for the densification of flexible graphite that has been patterned to facilitate air removal.

FIGS. 5A and 5B are schematic diagrams illustrating an example embodiment of apparatus 500 being used for the densification of flexible graphite that has been patterned to facilitate air removal. FIG. 5A is a plan view of apparatus 500. FIG. 5B is a side view of apparatus 500. The relative dimensions of the drums, graphite sheets and patterns thereon are exaggerated for the purposes of illustration.

Apparatus 500 comprises a pair of drums 510 and 520. Upper drum 510 rotates on upper spindle 512 counterclockwise about axis X-X (shown in FIGS. 5A and 5B). Rotation of upper spindle 512 is indicated by arrow A of FIG. 5B. Lower drum 520 rotates on lower spindle 522 clockwise about axis Y-Y (shown in FIG. 5B). Rotation of lower spindle 522 is indicated by arrow A* of FIG. 5B.

In the illustrated embodiment patterned flexible graphite 530 is patterned on one surface with a diamond pattern of grooves. This type of pattern has been found to be particularly effective in facilitating subsequent air removal during densification. Patterned flexible graphite 530 is fed into apparatus 500 as indicated by arrow B of FIG. 5B. Patterned flexible graphite is compressed between rotating upper and lower drums 510 and 520, and the densified material 535 leaves the apparatus as indicated by arrow B* of FIG. 5B. It is compressed to a final thickness indicated by arrows C and C* of FIG. 5B. As a result of the compression, air is expelled from the graphite material. Air trapped in the patterned flexible graphite flows through the matrix of grooves in the material and is expelled (particularly from the edges of the material), and as indicated by block arrows D and D*. In the example illustrated in FIGS. 5A and 5B surfaces 515 and 525 of drums 510 and 520, respectively, are smooth (un-patterned) and the diamond pattern is substantially removed from both surfaces 540 and 545 of densified material 535.

Figure 6A:
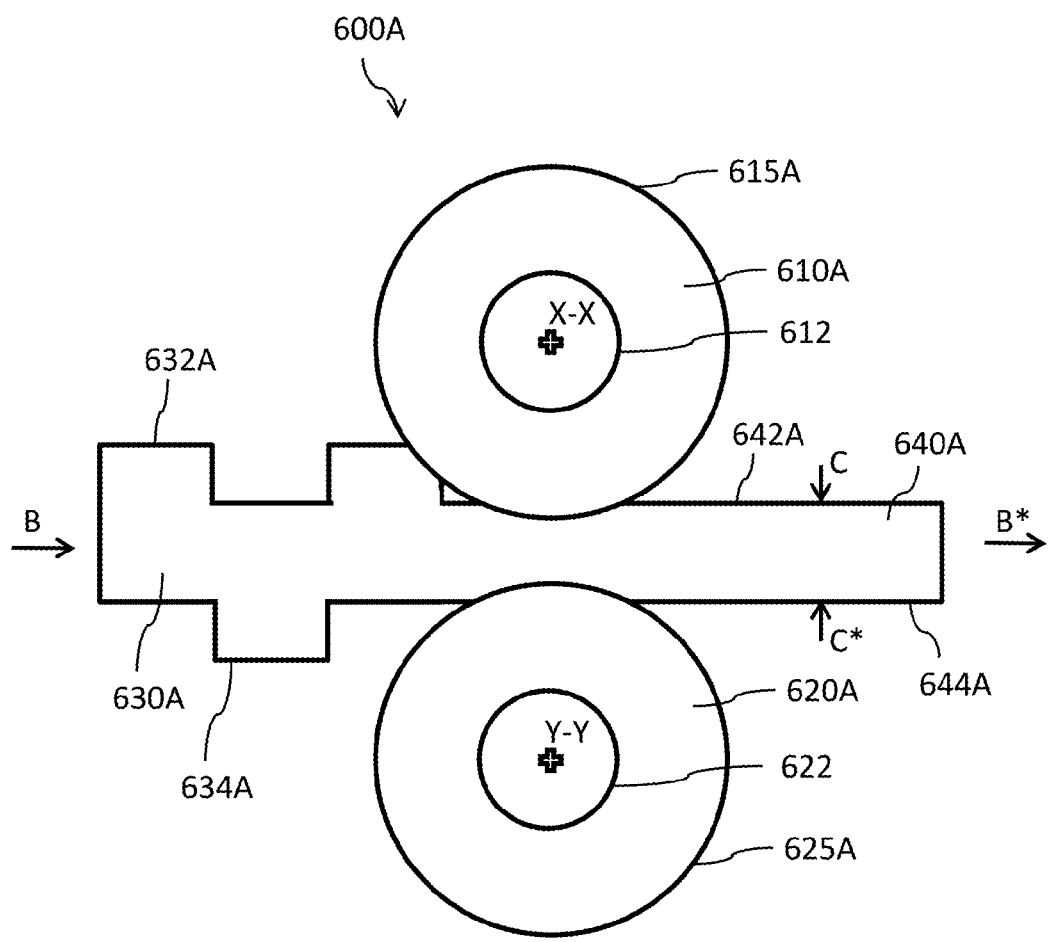
FIG. 6A is a schematic side view illustrating another example embodiment of an apparatus being used for further processing of flexible graphite that has first been patterned to facilitate air removal.
Figure 6B:
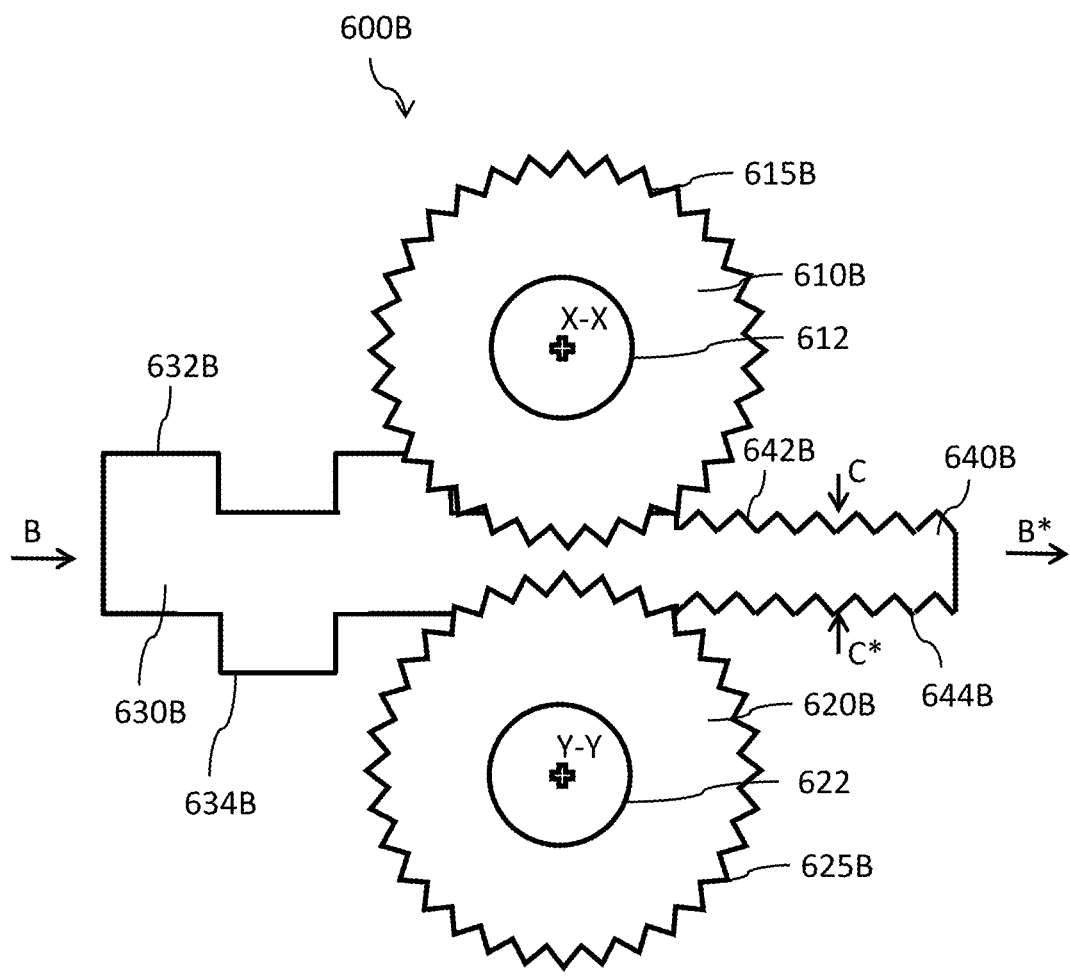
FIG. 6B is a schematic side view illustrating another example embodiment of an apparatus being used for further processing of flexible graphite that has first been patterned to facilitate air removal.
Figure 6C:
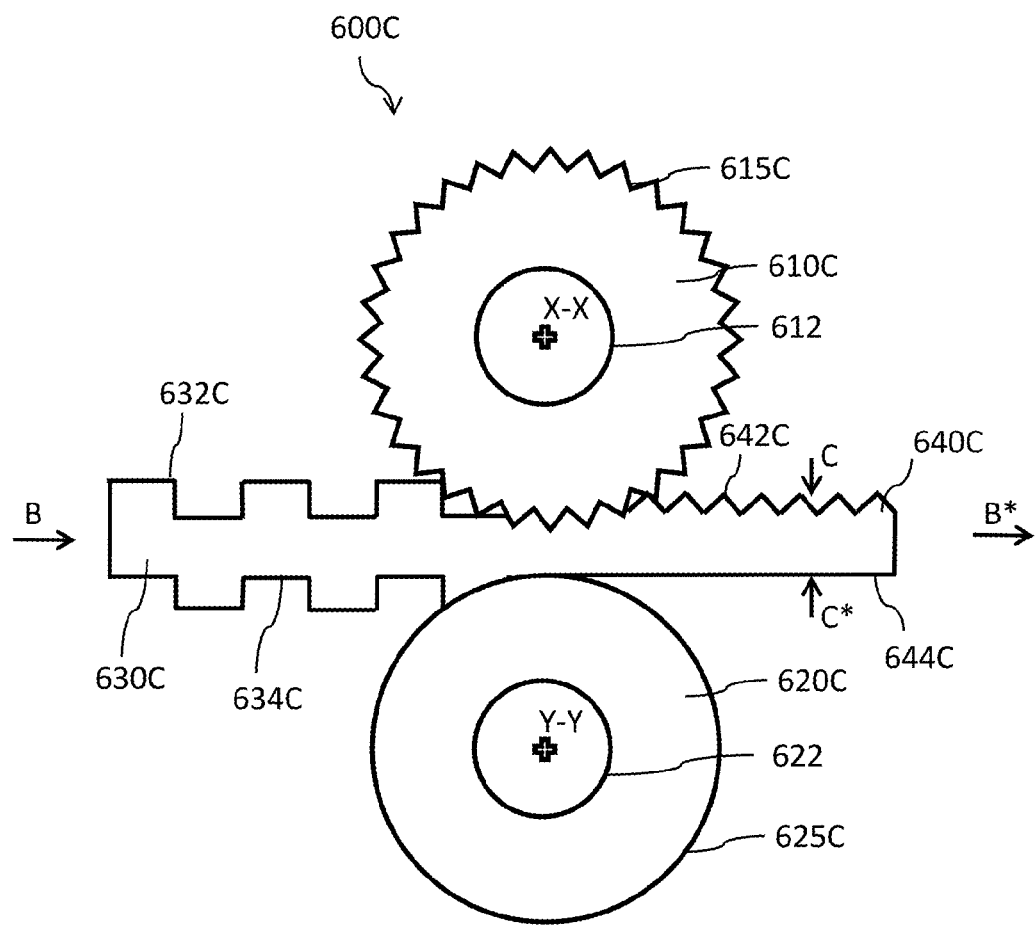
FIG. 6C is a schematic side view illustrating another example embodiment of an apparatus being used for further processing of flexible graphite that has first been patterned to facilitate air removal.

FIGS. 6A through 6C are schematic side views illustrating further example embodiments of an apparatus being used for further processing of flexible graphite that has first been patterned to facilitate air removal. FIGS. 6A through 6C are not to scale. The relative dimensions of the drums, graphite sheets and patterns thereon are exaggerated for the purposes of illustration.

FIG. 6A show apparatus 600A being used for densification of flexible graphite that has first been patterned to facilitate air removal. Apparatus 600A comprises upper drum 610A and lower drum 620A. Upper drum 610A rotates on upper spindle 612 about axis X-X (into the paper) and has upper drum surface 615A. Lower drum 620A rotates on a lower spindle 622 about axis Y-Y (into the paper) and has lower drum surface 625A. Upper drum surface 615A and lower drum surface 625A are essentially smooth (un-patterned).

A patterned graphite sheet 630A is fed between drums 610A and 620A as indicated by arrow B. Upper surface 632A and lower surface 634A of sheet 630A have been patterned via an offset calendering process. By offset, it is meant that the pattern on upper surface 632A is offset with respect to the pattern on lower surface 634A (see below). Processed sheet 640A leaves apparatus 600A as indicated by arrow B*. Upper surface 642A and lower surface 644A of processed sheet 640A are essentially smooth (with no substantial patterning). The thickness of processed sheet 640A is indicated by arrows C and C*.

FIG. 6B shows apparatus 600B being used for simultaneous densification and embossing of flexible graphite that has first been patterned to facilitate air removal. Apparatus 600B comprises upper drum 610B and lower drum 620B. Upper drum 610 rotates on upper spindle 612 about axis X-X (into the paper) and has upper drum surface 615B. Lower drum 620B rotates on lower spindle 622 about axis Y-Y (into the paper) and has lower drum surface 625B. Upper drum surface 615B and lower drum surface 625B have features formed therein.

Patterned graphite sheet 630B is fed between drums 610B and 620B as indicated by arrow B. Upper surface 632B and lower surface 634B of sheet 630B are patterned via an offset calendering process. Processed sheet 640B leaves apparatus 600B as indicated by arrow B*. Upper surface 642B and lower surface 644B of processed sheet 640B are embossed in accordance with corresponding surface features on drum surfaces 615B and 625B. The thickness of sheet 640B is indicated by arrows C and C*.

FIG. 6C shows apparatus 600C being used for simultaneous densification and embossing of flexible graphite that has first been patterned to facilitate air removal. Apparatus 600C comprises upper drum 610C and lower drum 620C. Upper drum 610C rotates on upper spindle 612 about axis X-X (into the paper) and has upper drum surface 615C. Lower drum 620C rotates on lower spindle 622 about axis Y-Y (into the paper) and has lower drum surface 625C. Upper drum surface 615C has features formed therein, and lower drum surface 625C is essentially smooth (with no substantial features).

Patterned graphite sheet 630C is fed between drums 610 and 620 as indicated by arrow B. Upper surface 632C and lower surface 634C of sheet 630C are patterned via an offset calendering process. Processed sheet 640C leaves apparatus 600C as indicated by arrow B*. Upper surface 642C of processed sheet 640 is embossed in accordance with the corresponding surface features formed on drum 615C, and lower surface 644C is essentially smooth (with no substantial patterning). The thickness of sheet 640C is indicated by arrows C and C*.

Figure 7A:
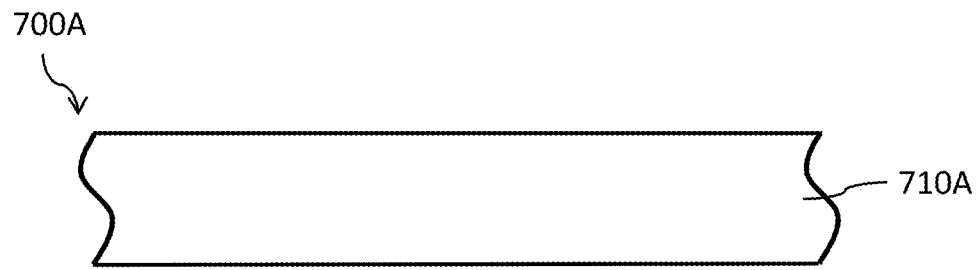
FIG. 7A is a schematic cross-sectional diagram illustrating standard stock of exfoliated graphite sheet 700A that is un-patterned.

FIG. 7A is a schematic cross-sectional diagram illustrating standard stock of exfoliated graphite sheet 700A that is un-patterned. Sheet 700A comprises graphite material 710A of approximately uniform density. In some embodiments, sheet 700A can comprise approximately 80% air and 20% graphite. Generally, as a consequence of the rolling operation, a majority of the graphite flakes are aligned within the exfoliated graphite sheet approximately in the plane of the sheet.

Figure 7B:
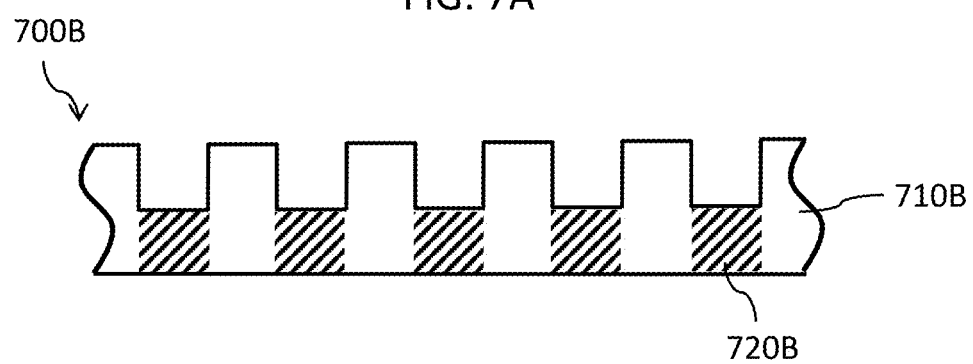
FIG. 7B is a schematic cross-sectional diagram illustrating exfoliated graphite sheet that has undergone single-sided calendering to pattern it on one side.
Figure 7C:
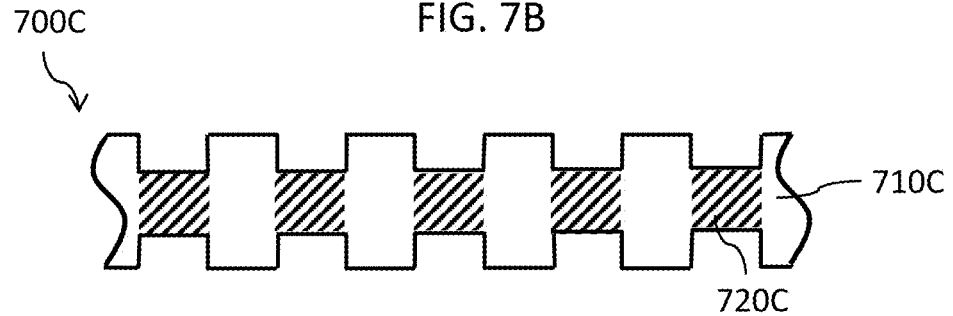
FIG. 7C is a schematic cross-sectional diagram illustrating a graphite sheet that has undergone double-sided calendering to pattern it on both sides.
Figure 7D:
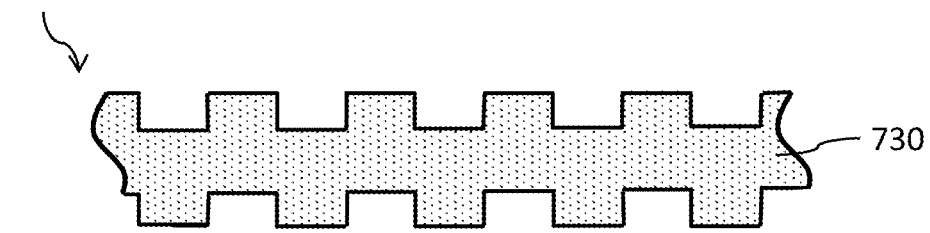
FIG. 7D is a schematic cross-sectional diagram illustrating a graphite sheet 700D that has undergone offset calendering.

FIGS. 7B through 7D are schematic cross-sectional diagrams illustrating examples of patterned graphite sheet material that can be further processed as described above.

FIG. 7B is a schematic diagram illustrating exfoliated graphite sheet 700B that has undergone single-sided calendering to pattern it on one side. An effect of the calendering process is to create variations in density in the patterned graphite sheet. Sheet 700B comprises regions of lower density graphite 710B and regions of higher density graphite 720B.

FIG. 7C is a schematic diagram illustrating graphite sheet 700C that has undergone double-sided calendering to pattern it on both sides. Sheet 700C comprises regions of lower density graphite 710C and regions of higher density graphite 720C. In the example shown, regions of higher density graphite 720C are located approximately mid-plane in the graphite sheet.

FIG. 7D is a schematic diagram illustrating graphite sheet 700D that has undergone offset calendering. In offset calendering, the first and second calenders both have a pattern of grooves formed in their surfaces. The patterns are offset with respect to each other to create an overall increase in density in the patterned graphite sheet. Sheet 700D comprises at least one region of increased density graphite 730 with respect to the density of the standard stock (such as sheet 700A of FIG. 7A).

For some applications, it can beneficial that the calendering process used to pattern the flexible graphite creates regions of higher density mid-plane in the sheet before compression and/or embossing of the final material. The calendering process can be configured to a) remove air during the calendering process, and b) prepare the material with regions of higher density mid-plane as well as patterning it. By having regions with higher density in the mid-plane of the sheet, further embossing can be used to form the surface rather than requiring additional roll-forming to increase density.

Figure 8A:
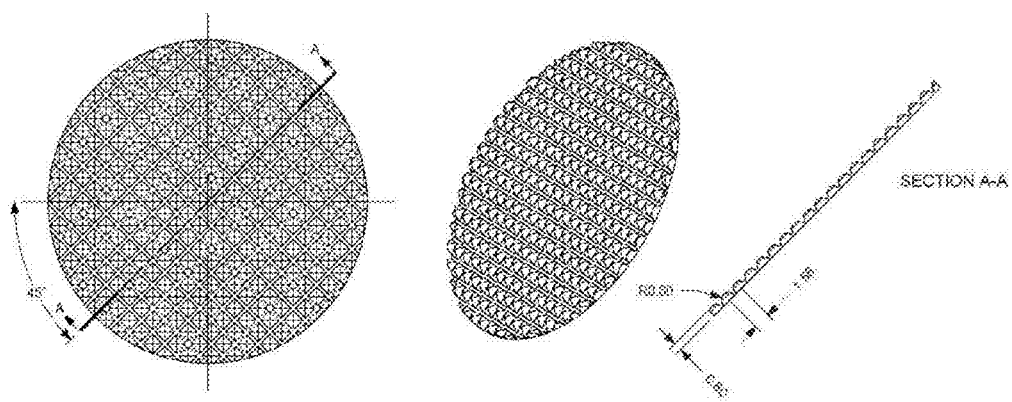
FIGS. 8A through 8C are engineering drawings of examples of dies that can be used for patterning flexible graphite.
Figure 8B:
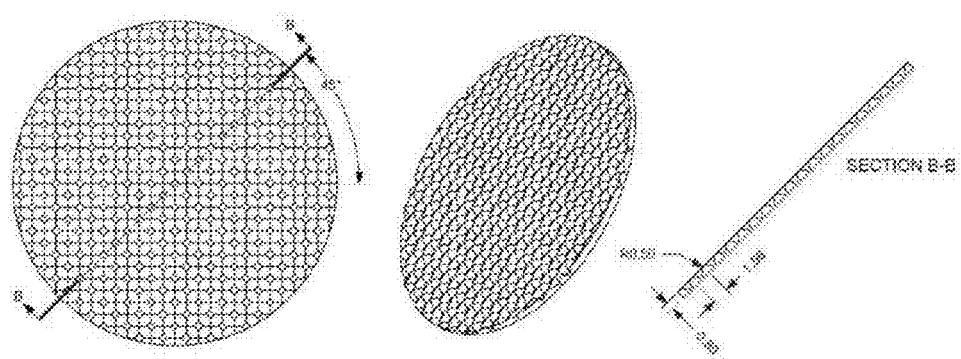
Figure 8C:
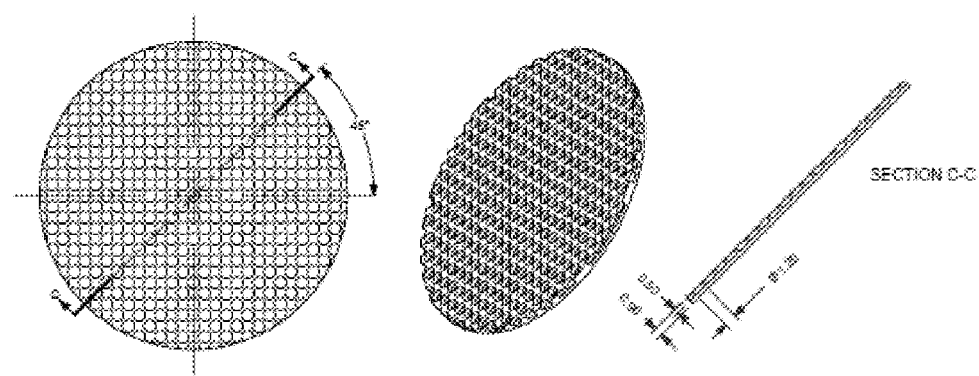

The patterning process can be performed using a patterned die. FIGS. 8A through 8C are engineering drawings of dies that can be used to pattern flexible graphite. FIG. 8A shows a die with a cross-hatched diamond pattern of grooves. FIG. 8B shows a die with a cross-hatched square pattern of grooves. FIG. 8C shows a die with an array of circular depressions which can be used to form an array of protruding "buttons" on the surface of a graphite sheet material. In some embodiments the buttons are about 0.8-1.1 mm in diameter with a depth of about 0.4-0.5 mm, and a spacing of 0.5-1.5 mm. In some embodiment the buttons are smaller than 0.8 mm in diameter and are more closely spaced.

The pattern can be selected to facilitate downstream air removal and densification as well as taking into account the overall and local densities of the graphite material that are desired in the final part after subsequent processing. For example, in a regular fuel cell plate it is often preferable to have an area densification of at least approximately 1.8 g/cm$^3$ in order to maintain the integrity of the part when deployed in a hydrogen or liquid environment.

Figure 9A:
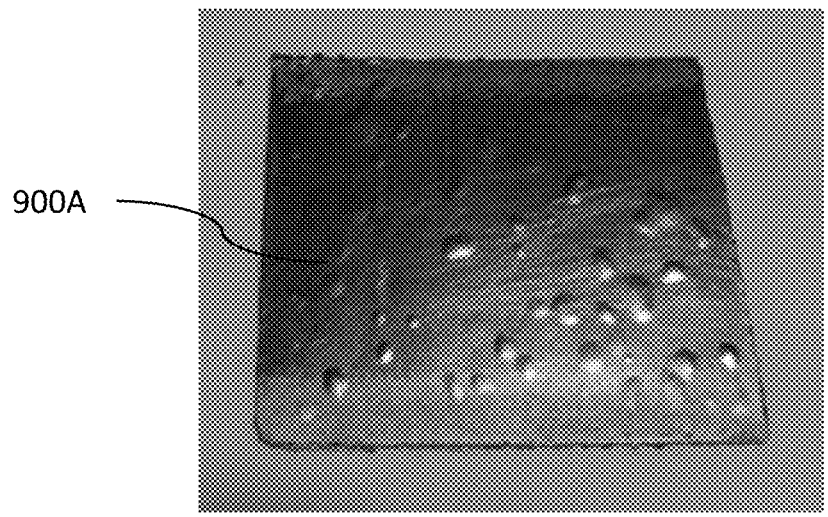
FIG. 9A is a black and white photograph of piece of flexible graphite sheet material that has been compressed using a conventional process.

FIG. 9A is a black and white photograph of a piece of commercially available flexible graphite sheet material 900A (TG797, 70 mg/cm$^2$, thickness 3 mm) that was compressed at 300 kN using a conventional roller calendering process. The surface of compressed densified sheet material 900A shows significant blistering. The blistering is indicative of air trapped in the compressed flexible graphite sheet material.

Figure 9B:
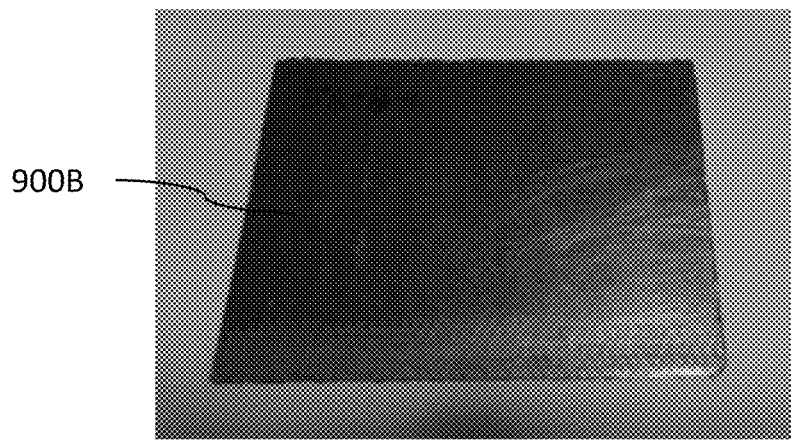
FIG. 9B is a black and white photograph of piece of flexible graphite sheet material that has been compressed using an embodiment of the present method.

FIG. 9B is a black and white photograph of a piece of commercially available flexible graphite sheet material 900B (TG797, 70 mg/cm$^2$, thickness 3 mm) that was first patterned with a diamond pattern (with diamond-shaped protrusions and embossed channels) and then compressed at 300 kN using a die press. Compressed densified sheet material 900B shows no signs of blistering. The lack of blistering is indicative of effective air removal by the present method.

The above-described apparatus and method have been successfully used to prepare graphite sheet material having densities in the range of about 1.9 to 2.2 g/cm$^3$ without use of a vacuum during the compression process. Typically using conventional densification processes (without the use of a vacuum) densities of about 1.6 to 1.8 g/cm$^3$ are achieved.

In the above described methods for densification (and in some of the other methods described below) air that is present in the pores of the graphite sheet material can effectively serve as a fluid medium within which the graphite flakes or particles can be moved or re-oriented in desirable and controlled ways during processing of the material as the air is expelled.

Patterning for Improved Lamination of Flexible Graphite

It has been found that patterning the surface of sheets of flexible graphite prior to laminating the sheets together can improve the lamination process, for example, by creating a stronger bond between the adjacent sheets and/or increasing the homogeneity of the laminated material so that the interface between the laminated sheets is more difficult to discern. This can result in a reduced tendency for delamination and/or more uniform properties in the laminated material. Preferably the graphite sheet is patterned so that it has multiple discrete protrusions of lower density surrounded by interconnecting pathways or channels, rather than an array of discrete indentations. For example a diamond pattern, button pattern or inverse waffle-pattern can be used. This approach can eliminate, or at least reduce, the need for vacuum systems or other elaborate air removal systems during lamination.

Figure 10A:
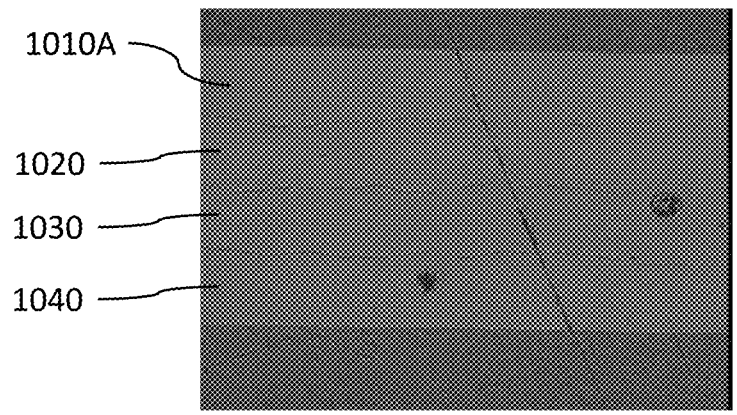
FIG. 10A is an Olympus IX70 inverted epi-fluorescence research microscope image illustrating a laminated sheet of flexible graphite produced by a conventional process.

FIG. 10A is an Olympus IX70 inverted epi-fluorescence research microscope image (magnification 250×) illustrating first laminated sheet 1010A of flexible graphite produced by a conventional process. Four pieces of un-patterned flexible graphite sheet material (TG797, 70 mg/cm$^2$, thickness 1 mm) were stacked in a die cavity that constrained the sides of the part and compressed using a compression press at 90 kN to produce first laminated sheet 1010A comprising four layers of flexible graphite. The interfaces between each layer 1020, 1030 and 1040 are clearly visible in the image. The poor homogeneity of structure at the interfaces can cause a reduction in the through-plane thermal and/or electrical conductivity of the laminated material which is undesirable for some applications.

Figure 10B:
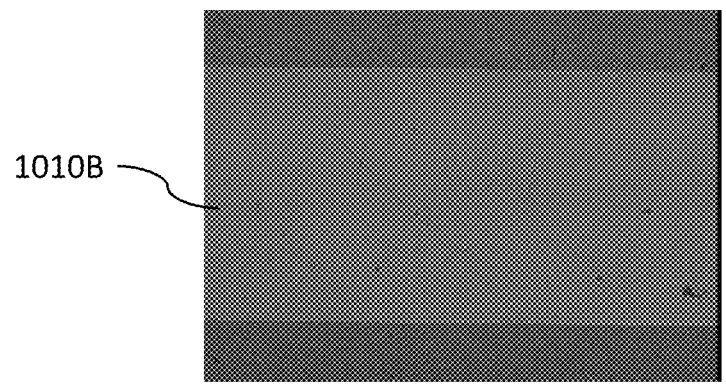
FIG. 10B is an Olympus IX70 inverted epi-fluorescence research microscope image illustrating a laminated sheet of flexible graphite produced by an embodiment of the present method.

FIG. 10B is an Olympus IX70 inverted epi-fluorescence research microscope image (magnification 250×) illustrating second laminated sheet 1010B of flexible graphite produced by an embodiment of the present method. Four pieces of flexible graphite sheet material (TG797, 70 mg/cm$^2$, thickness 3 mm) were pre-calendered to a thickness of 2 mm and then patterned with a 45 degree diamond pattern (with diamond-shaped protrusions surrounded by channels) using roller embossing apparatus. The patterned sheets stacked in a die cavity that constrained the sides of the part, and compressed using a compression press at 90 kN to produce second laminated sheet 1010B. Second laminated sheet 1010B comprises four layers of flexible graphite. The interface between the adjacent layers are not visible in the microscope image. The lack of visible interfaces in the microscope image is indicative of improved lamination by the present method. It seems that the diamond pattern (which has interconnected channels surrounding diamond-shaped protrusions on the surface of the graphite sheet material) provides a path for air to be expelled. This seems to allow flake mobility as the adjacent layers are brought together, so that graphite flakes in the lower density diamond-shaped protrusions on adjacent layers intermix, improving the homogeneity of the interface.

This approach of patterning and then laminating can be used to bring entire sheets of flexible graphite material together, or can be used to join layers of flexible graphite together just in localized regions. The patterned materials can be laminated together using a flat plate die press or rollers (calendering). In some circumstances rollers are more effective at eliminating the air and creating a homogenous interface.

Patterning for Improved Flexibility and Formability

It has also been found that patterning the surface of sheets of graphite sheet material can enhance the physical properties of the material rendering it more flexible so that it can be formed or shaped into three-dimensional structures, for example by folding, bending, pleating, or corrugating. The patterning can allow a tighter radius on the folds or bends before the material splinters or cracks relative to a similar un-patterned material. In conventional approaches an elastomeric resin is sometimes incorporated into graphite sheet material to render it more flexible. The present approach of patterning can provide highly flexible graphite sheet materials without the need to incorporate resin.

Figure 11A:
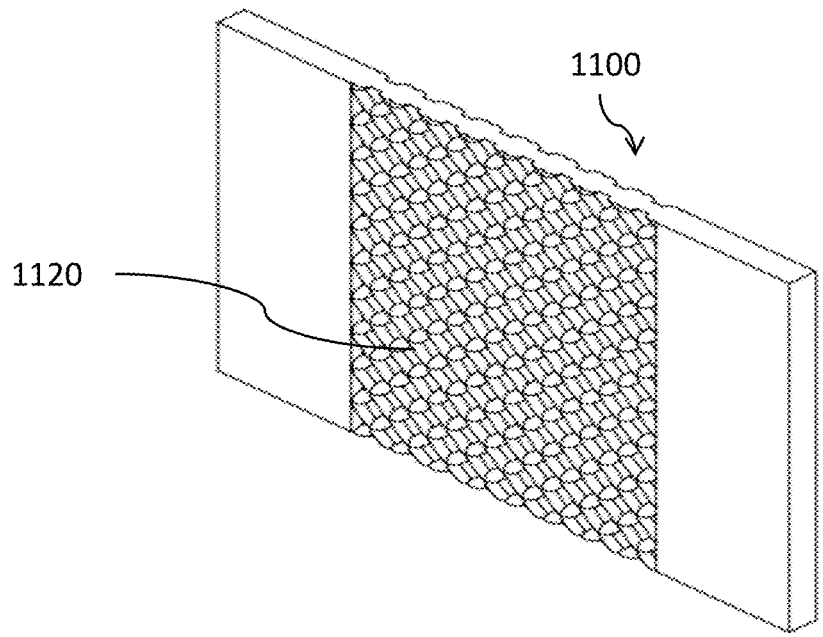
FIG. 11A is a schematic diagram of a piece of graphite sheet material that has been selectively patterned on both sides.
Figure 11B:
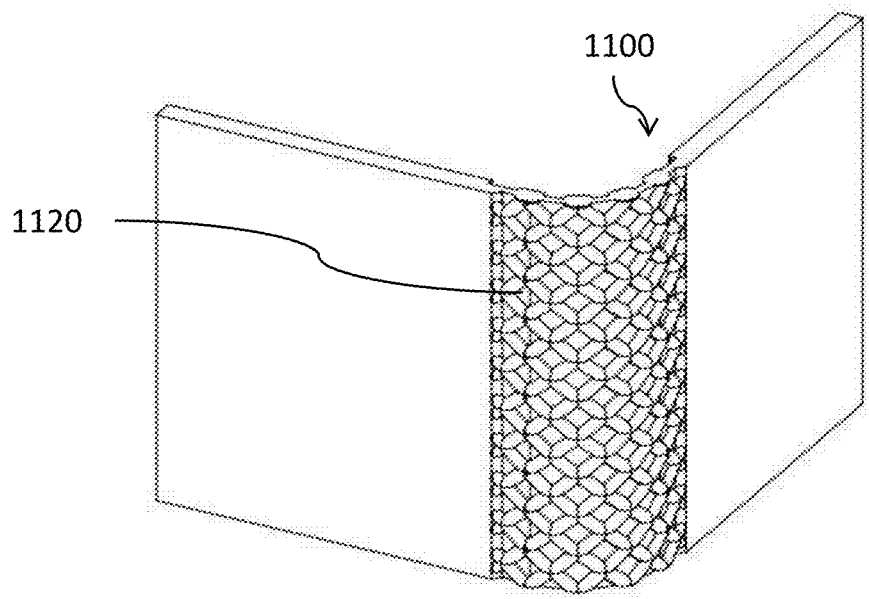
FIG. 11B is a schematic diagram of the selectively patterned piece of graphite sheet material illustrated in FIG. 11A that has been folded in the patterned region.

FIG. 11A shows a schematic diagram of a piece of graphite sheet material 1100 that has been selectively patterned by embossing a diamond pattern on both sides in region 1120. FIG. 11B shows the piece of graphite sheet material 1100 that has been bent or folded in the patterned region 1120.

Figure 12A:
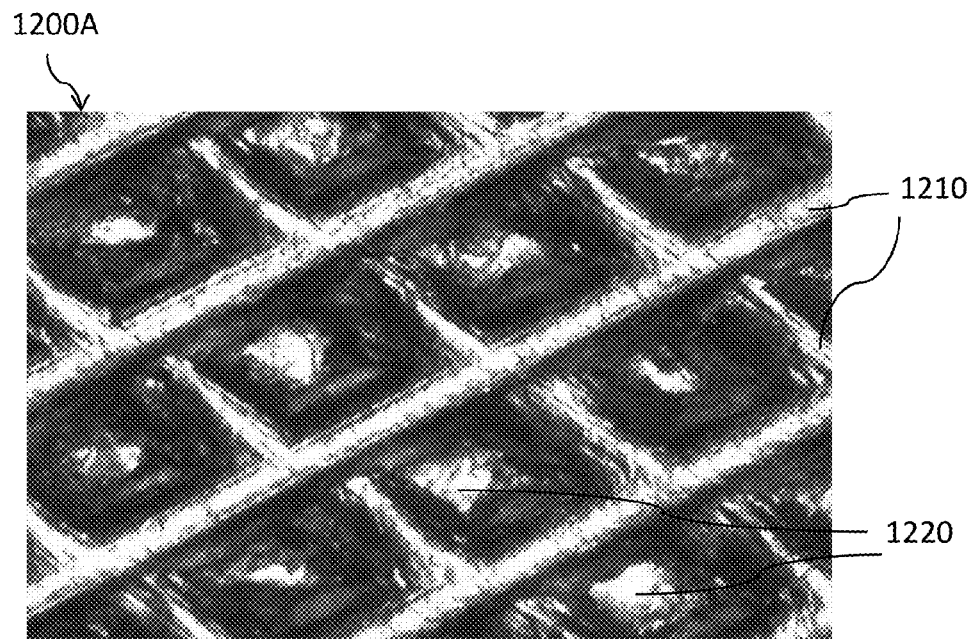
FIG. 12A is photograph of the surface of a graphite sheet material that has been patterned with a diamond pattern of grooves.

FIG. 12A illustrates an embodiment of a patterned graphite sheet material. FIG. 12A is a photograph of the surface of a graphite sheet material 1200A that has been patterned with a diamond pattern of grooves 1210. Two sets of parallel grooves are angled at about 30 degrees to one another forming an array of diamond-shaped protrusions 1220. In some embodiments grooves 1210 are about 0.5-1.0 mm wide and are spaced about 0.5-1.5 mm apart.

Figure 12B:
FIGS. 12B-D are schematic cross-sectional diagrams showing how bending tests were performed on graphite sheet materials.
Figure 12C:
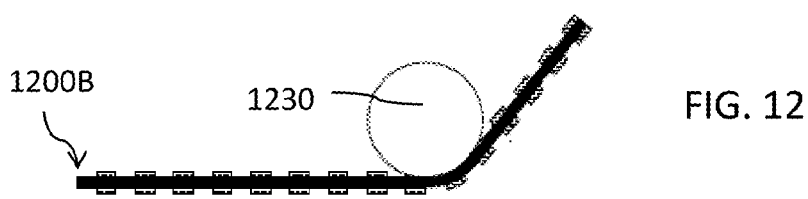
Figure 12D:
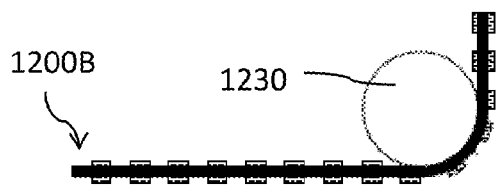

FIGS. 12B-D are schematic cross-sectional diagrams showing how bending tests were performed on patterned graphite sheet material 1200B by wrapping it around ⅜ inch diameter wooden dowel rod 1230 as shown.

Figure 13A:
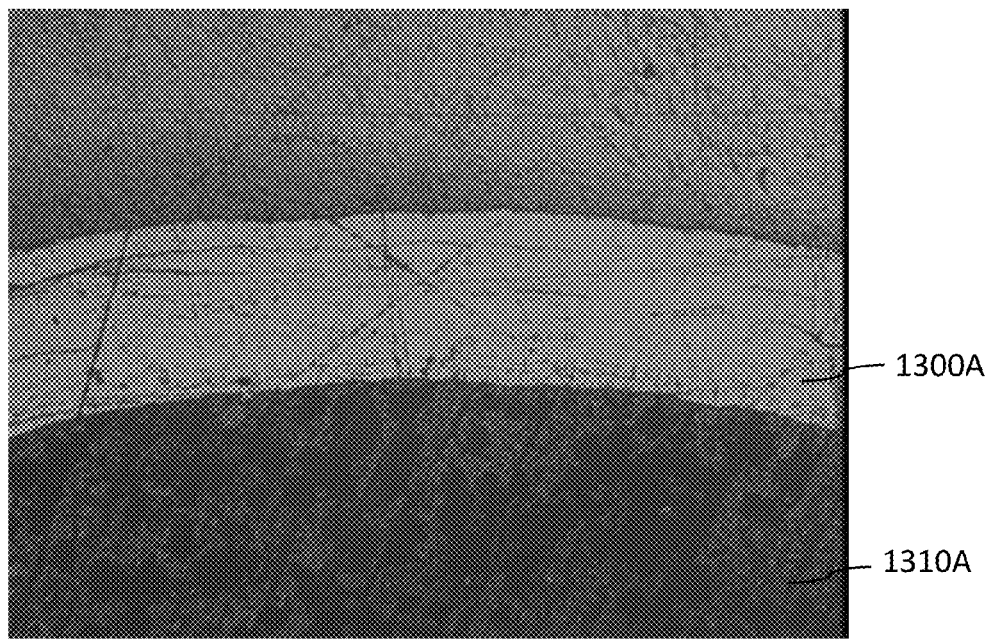
FIG. 13A is a microscope image of a sheet of un-patterned graphite sheet material wrapped around a wooden dowel rod.

FIG. 13A is a microscope image (250× magnification) showing sheet of un-patterned graphite sheet material 1300A wrapped around ⅜ inch diameter wooden dowel rod 1330B as shown. Material 1300A was prepared by calendering graphite sheet material with a thickness of 3 mm (70 mg/cm$^2$) to a thickness of 0.5 mm using smooth rollers. The sample was glued to the dowel rod and a cross-sectional sample was cut, mounted, polished and imaged with an Olympus IX70 inverted epi-fluorescence research microscope. Similar tests were performed with patterned sheets of graphite material.

Figure 13B:
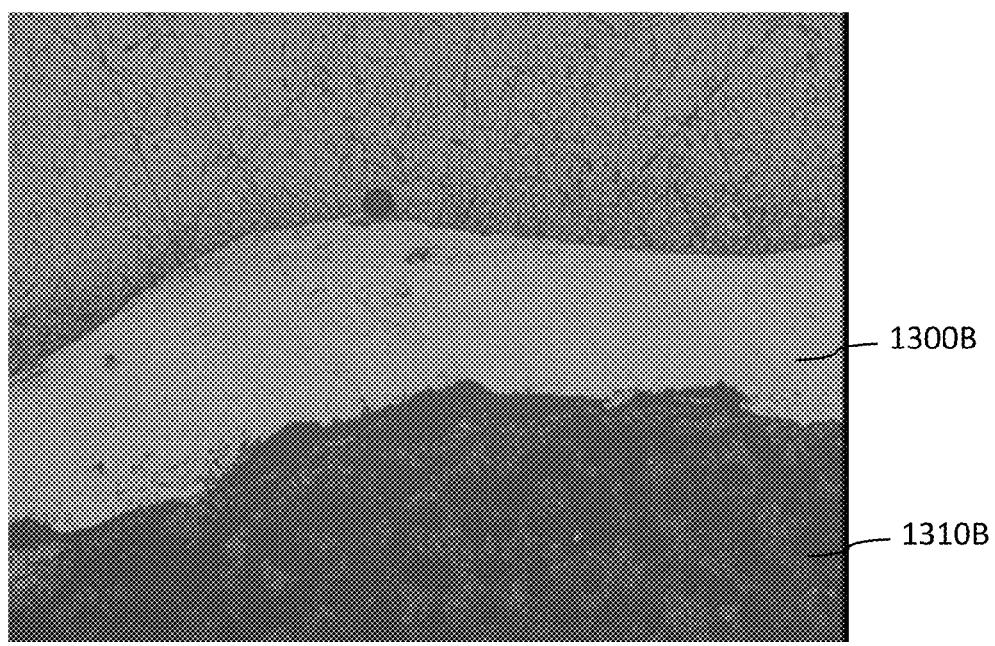
FIG. 13B is a microscope image of a sheet of patterned graphite sheet material wrapped around a wooden dowel rod.

FIG. 13B is a microscope image (250× magnification) of sheet of patterned graphite sheet material 1300B wrapped around wooden dowel rod 1310B. Material 1300B was prepared by calendering graphite sheet material with a thickness of 3 mm (70 mg/cm$^2$) to a thickness of 0.5 mm and patterning it with a 30 degree diamond pattern. The sample was like the material shown in FIG. 12A and the dowel rod was in a horizontal orientation relative to the pattern as shown in FIG. 12A.

Un-patterned material 1300A cracked and splintered when it was wrapped around the dowel rod. Surface cracks, internal splitting and delamination can be seen in the image of material 1300A shown in FIG. 13A. The image of patterned material 1300B in FIG. 13B shows very little evidence of cracking or delamination indicating less disruption of the graphite flake structure upon bending or folding the material. In these particular tests, a 30 degree diamond pattern appeared to give better results than a 45 degree diamond pattern or a square grid pattern in terms or reducing the tendency of the material to crack and split upon bending.

Processing of Flexible Graphite to Increase Through-Plane Thermal Conductivity

Flexible graphite sheet materials prepared by compressing exfoliated graphite particles tend to have highly anisotropic structures because of the preferential orientation of the graphite particles parallel to the opposed major surfaces of the sheet (perpendicular to the direction of compression). The bonding between flakes in the in-plane direction is governed by different physical forces than the bonding in the through-plane direction. The properties of such materials, such as thermal and electrical conductivity, therefore tend to be highly directional. Generally the in-plane thermal and electrical conductivity of these materials is many times greater than the through-plane thermal and electrical conductivity. For some applications this directionality of properties is beneficial. For example, for heat spreaders materials with high in-plane thermal conductivity are generally desirable as they will more efficiently spread heat laterally.

For other applications it is desirable to be able to reduce the anisotropy of graphite sheet materials and reduce the ratio of their through-plane to in-plane thermal and/or electrical conductivity. For example, for some applications, it can be beneficial to increase the thermal conductivity of the flexible graphite sheet in the through-plane direction.

Apparatuses and methods for reducing anisotropy of graphite sheet materials and/or increasing the thermal conductivity of graphite sheet material in the through-plane direction are discussed below.

In one approach, the through-plane thermal conductivity of materials made by compressing exfoliated graphite can be increased by reducing the size of the graphite particles or flakes and/or randomizing their orientation prior to compression. Even without the use of patterning, by reducing the size of the graphite particles or flakes and/or randomizing their orientation prior to compression, a more isotropic material with a lower ratio of in-plane to through-plane thermal conductivity can be obtained. Using this approach materials with a through-plane conductivities of about 20 W/mK to 30 W/mK have been obtained.

Figure 14:
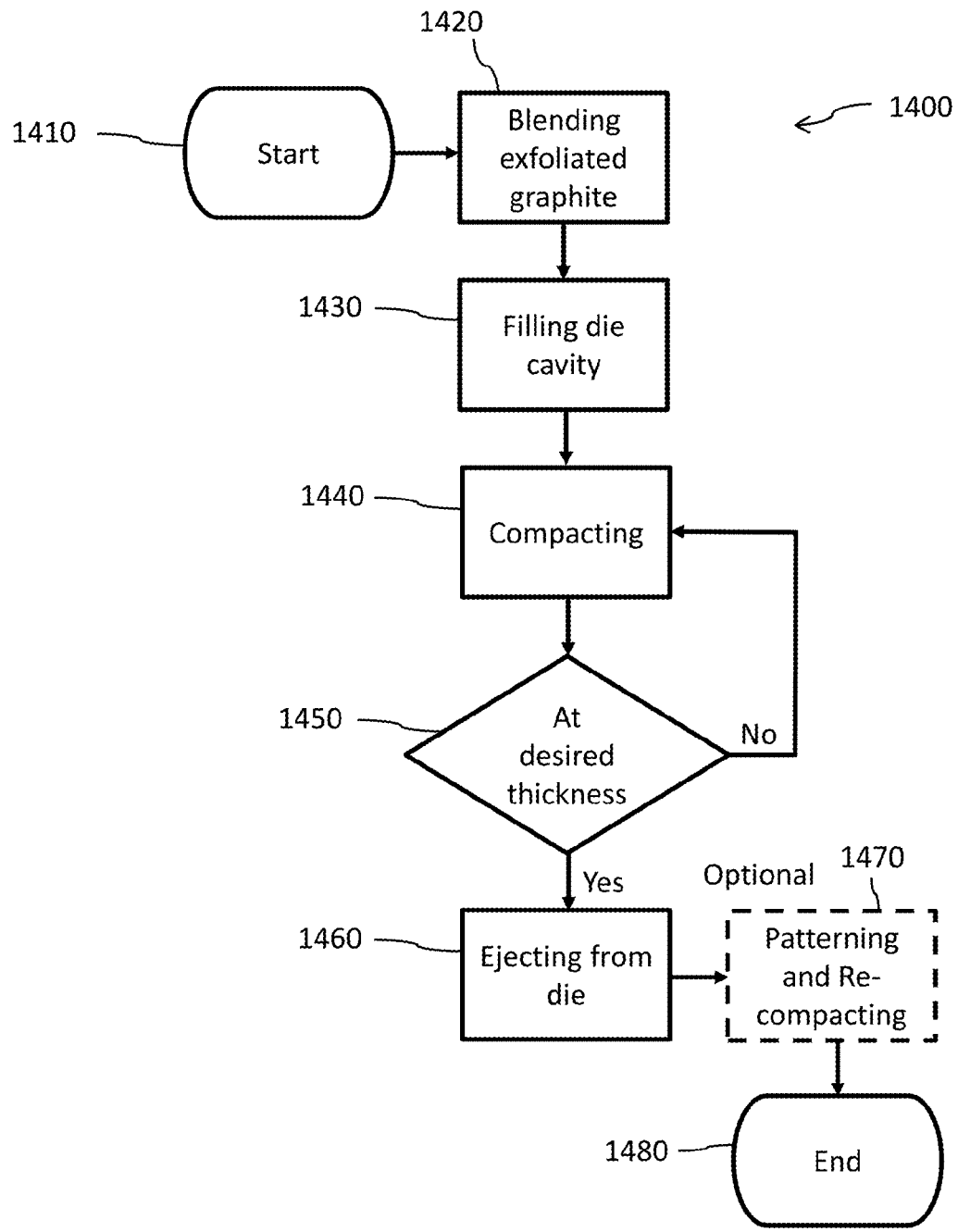
FIG. 14 is a flow chart showing an embodiment of a method for increasing through-plane thermal conductivity of flexible graphite.

FIG. 14 is a flow chart showing an embodiment of method 1400 for increasing through-plane thermal conductivity of flexible graphite. Method 1400 starts at step 1410. At step 1420, exfoliated graphite is blended, for example using an industrial blender. In this context, blending refers to chopping up the exfoliated graphite into smaller particles. At step 1430, a suitable quantity of blended graphite (in powder form after blending) is transferred to a cavity in a die. At step 1440, the blended graphite in the die is compacted using one or more punches. At step 1450, the thickness is tested to determine whether the desired thickness of graphite has been achieved. If not, method 1400 returns to step 1440. When the desired thickness is reached, method 1400 proceeds to step 1460 and the compacted graphite material can be ejected from the die.

At step 1470, the compacted graphite is optionally patterned on one or both sides. Patterning can be used to increase the orientation of the graphite flakes perpendicular to the plane of the material (as described in further detail below) resulting in a material that has an even higher through-plane thermal conductivity. Patterning is accomplished by replacing a smooth insert at the base of the die cavity by a patterned insert and or using a patterned die press. Suitable inserts can, for example, have patterns similar to those on patterned dies illustrated in FIGS. 8A through 8C. With the patterned insert and or die in place, the graphite is re-compacted. Step 1470 is optional and method 1400 can proceed directly from step 1460 when the desired thickness is reached to step 1480. In some embodiments the patterned material from step 1470 is compressed again using a smooth insert so that the surface(s) are essentially flat, but the material retains some increased orientation of graphite flakes perpendicular to the plane of the material as a result of the patterning Method 1400 ends at step 1480. In some embodiments, the resulting graphite material can be produced in 100-200 micron sheets or pieces.

Figure 15A:
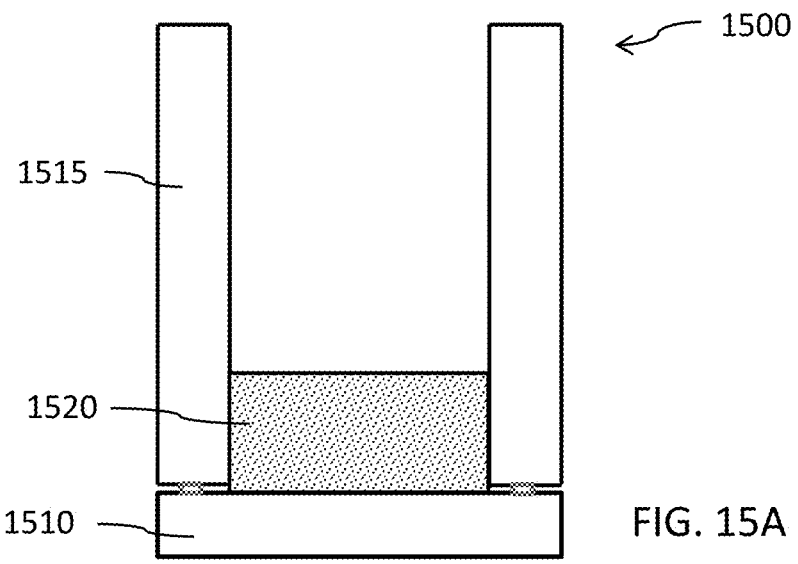
FIGS. 15A and 15B are schematic diagrams showing an apparatus for compaction of exfoliated graphite.
Figure 15B:
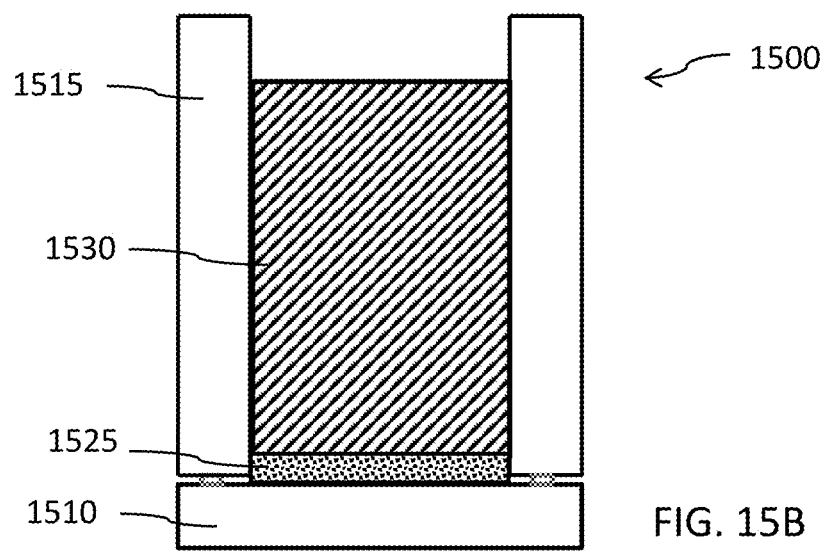

FIGS. 15A and 15B are schematic cross-sectional diagrams showing die fixture apparatus 1500 for compaction of exfoliated graphite. Apparatus 1500 comprises base plate 1510, die cylinder 1515 and punch 1530 (shown in FIG. 15B). Punch 1530 can also be referred to as a press or ram. Punch can be patterned or can be smooth (as shown) or a screen can be used as described below. Similarly base plate

1510 can be flat of can be fitted with a patterned insert (not shown) to allow the material to be patterned on both sides. Die cylinder 1515 is spaced slightly from base plate 1510 to allow air to escape during compression. Blended exfoliated graphite material 1525 is placed in the die cavity. Punch 1530 of FIG. 12B is used to compact material 1520 of FIG. 15A to produce compacted material 1525 of FIG. 15B.

Figure 16A:
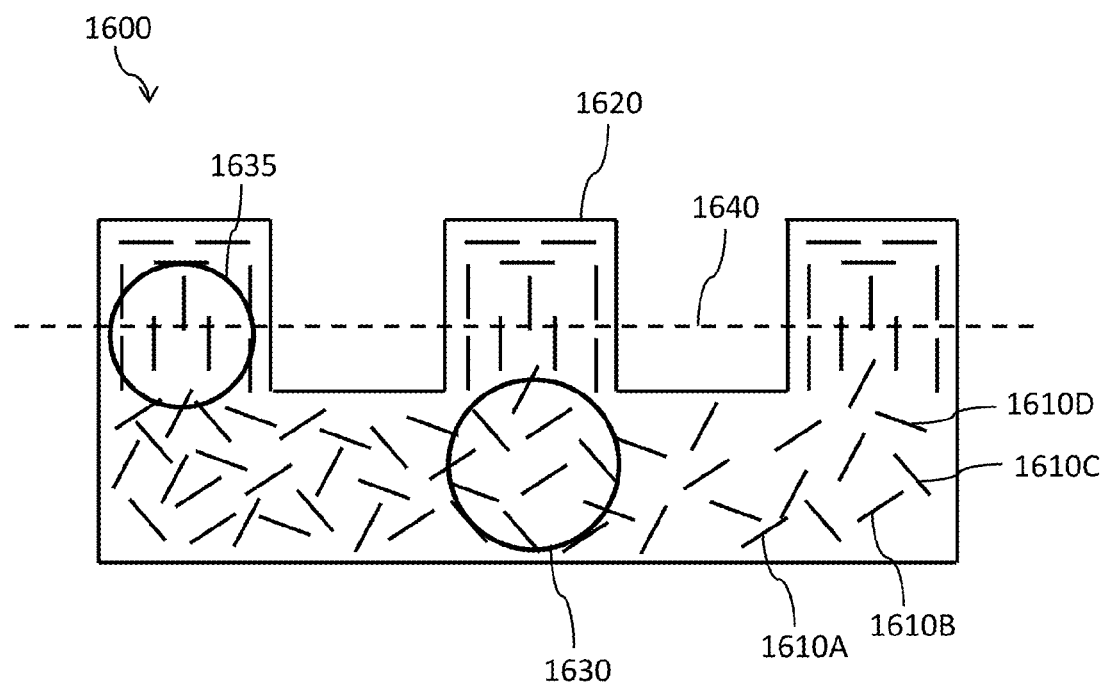
FIGS. 16A and 16B are schematic diagrams of graphite sheet material produced by the method of FIG. 14 for increasing through-plane conductivity.
Figure 16B:
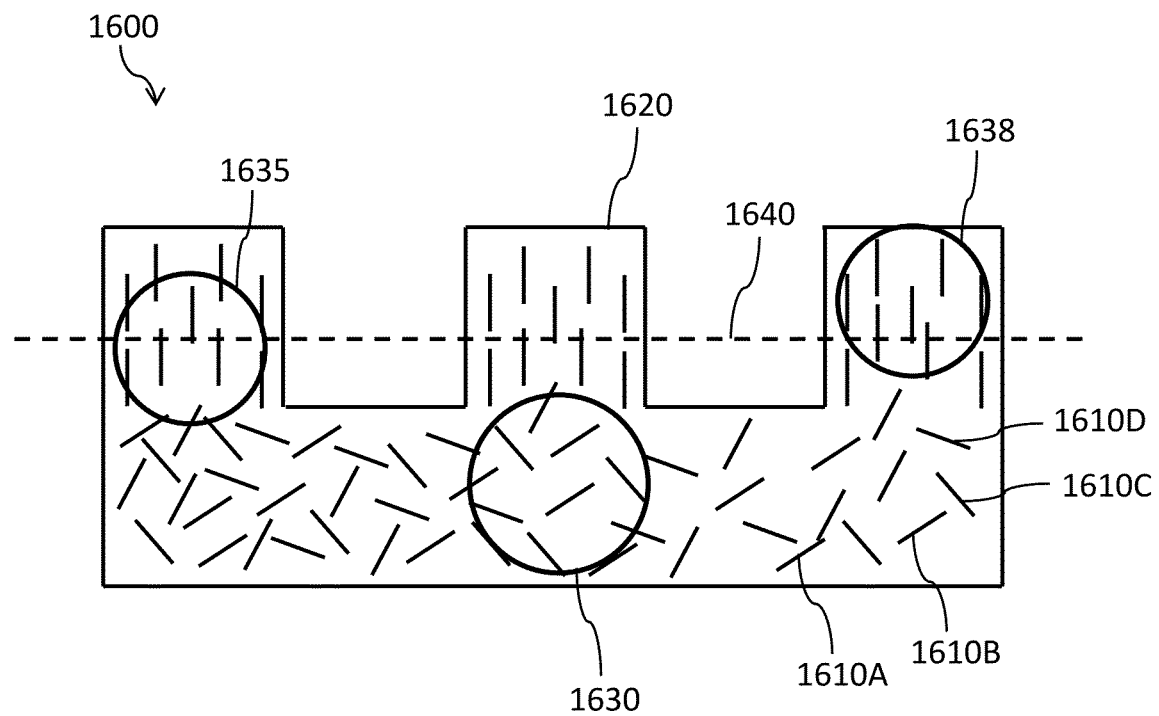

FIGS. 16A and 16B are schematic diagrams of flexible graphite material 1600 produced by method 1400 of FIG. 14. Flexible graphite material 1600 is shown in cross-section and comprises a plurality of graphite flakes such as graphite flakes 1610A through 1610D.

Material 1600 has been compacted by method 1400 of FIG. 14 using a patterned punch, such as punch 1530 of FIG. 15B. The upper surface of material 1600 has a castellated cross-section 1620.

Graphite flakes in the lower region of material 1600, such as in circle 1630 for example, are oriented essentially in a random fashion or at least with less in-plane orientation of graphite flakes than would be produced by a conventional roller compression process using exfoliated graphite.

Graphite flakes in the upper region of material 1600, such as in circle 1635 for example, are oriented essentially in a perpendicular or through-plane direction or at least with a majority of the graphite flakes oriented in a direction that is generally perpendicular to the plane of the material.

FIG. 16A shows a first example where there is less "vertical" orientation of flakes at the top of each castellated region. Material 1600 can be post-processed by removing the uppermost layer as indicated by line 1640. This exposes graphite flakes that are oriented essentially perpendicular to the plane of the material. Removal can be accomplished by polishing, shaving, milling, scraping or other suitable methods.

FIG. 16B shows a second example where flakes are oriented essentially in a perpendicular or through-plane direction (or at least with a majority of the graphite flakes oriented perpendicular to the plane of the material) at the top 1638 of each castellated region. Material 1600 in the second example has exposed graphite flakes oriented essentially in a perpendicular or through-plane direction.

In another approach, the through-plane to in-plane thermal conductivity ratio of a conventional highly anisotropic graphite sheet material (produced by calendering exfoliated graphite) can be increased by patterning graphite sheet material. By further compressing the material with a patterned die or roller the orientation of the graphite flakes can be altered so that a significant portion of the flakes (at least near the patterned surface of the material) are oriented perpendicular to the plane of the material. The flakes tend to get pushed or moved into the grooves or cavities during the compression process.

Again the material can be patterned, for example, with one set of parallel channels and corresponding ribs between the channels (as for improved densification and lamination as described above). However, in some preferred embodiments configured to increase the through-plane thermal conductivity, the graphite material is patterned with an array of small protrusions, such as diamonds, squares or circular buttons or dots. In some preferred embodiments, the sides of the channels or protrusions are perpendicular to the plane of the material—in other words the features on the patterned die or roller or screen that is used to pattern the material have "vertical" side walls.

Figure 17A:
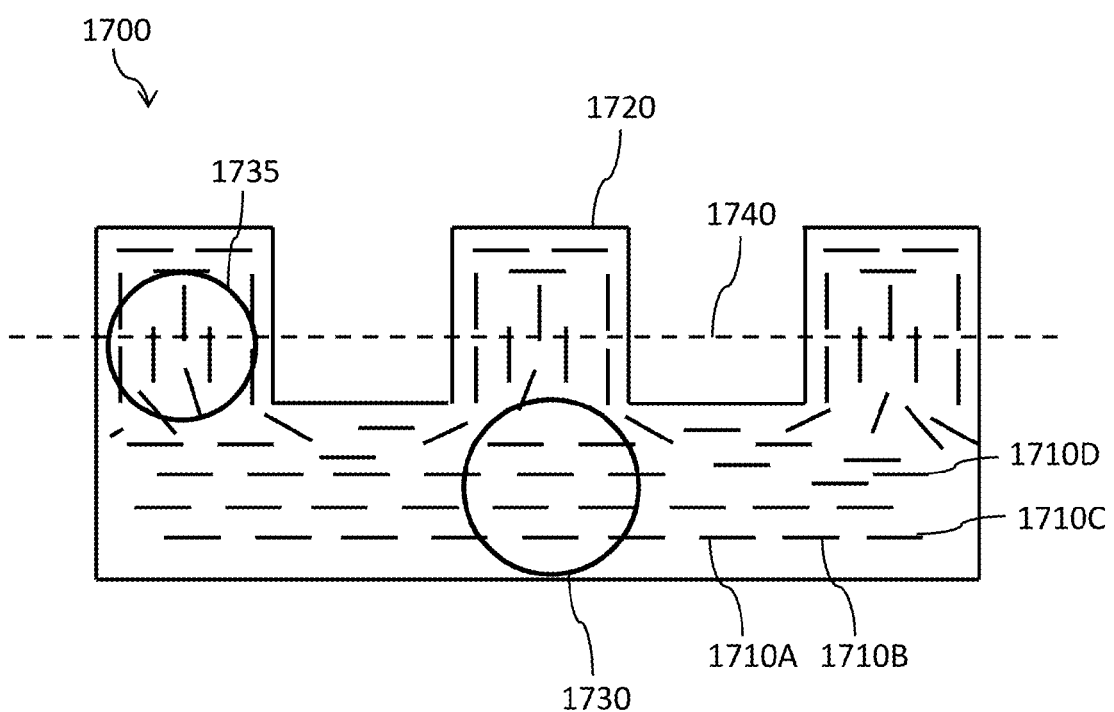
FIGS. 17A and 17B are schematic diagrams of graphite sheet material by another embodiment of a method for increasing through-plane conductivity.
Figure 17B:
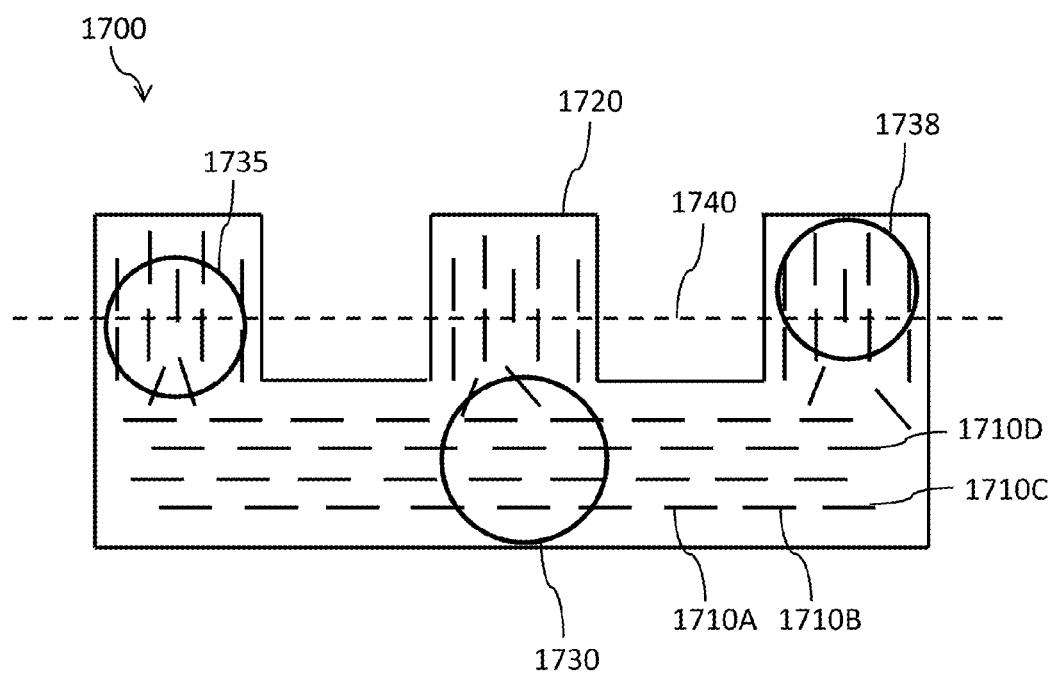

FIGS. 17A and 17B are schematic diagrams of flexible graphite material 1700 produced by patterning conventional highly anisotropic graphite sheet material in a manner which alters the orientation of a significant portion of the flakes (at least near the patterned surface of the material) so that they are oriented perpendicular to the plane of the material. Flexible graphite material 1700 is shown in cross-section and comprises a plurality of graphite flakes such as graphite flakes 1710A through 1710D.

Material 1700 has been patterned using a roller, die press or other method. The upper surface of material 1700 has patterned cross-section 1720 comprising a plurality of ribs and/or discrete protrusions.

Graphite flakes in the lower region of material 1700, such as in circle 1730 for example, are oriented predominantly in-plane. Graphite flakes in the upper region of material 1700, such as in circle 1735 for example, are oriented essentially in a perpendicular or through-plane direction or at least with a majority of the graphite flakes oriented generally perpendicular to the plane of the material.

FIG. 17A shows a first example where there is less "vertical" orientation of flakes at the top of the patterned surface. Material 1700 can be post-processed by removing the uppermost layer as indicated by line 1740. This exposes graphite flakes that are oriented essentially perpendicular to the plane of the material. Removal can be accomplished by polishing, shaving, milling, scraping or other suitable method.

FIG. 17B shows a second example where flakes are oriented essentially in a perpendicular or through-plane direction (or at least with a majority of the graphite flakes oriented generally perpendicular to the plane of the material) at top 1738 of the patterned surface. Material 1700 in the second example has exposed graphite flakes oriented essentially perpendicular to the plane of the material.

In some embodiments of a method for increasing the through-plane conductivity of a graphite sheet material, a perforated screen is used to pattern the graphite sheet material. The graphite material is compressed against the screen and graphite flakes are squeezed into the perforations to form the pattern. This can offer advantages over a patterned die or roller where the "cavities" into which the graphite flakes are dead-ended or enclosed spaces. The open perforations can allow even greater perpendicular orientation of the graphite flakes as they are not constrained by the cavity.

Figure 18A:
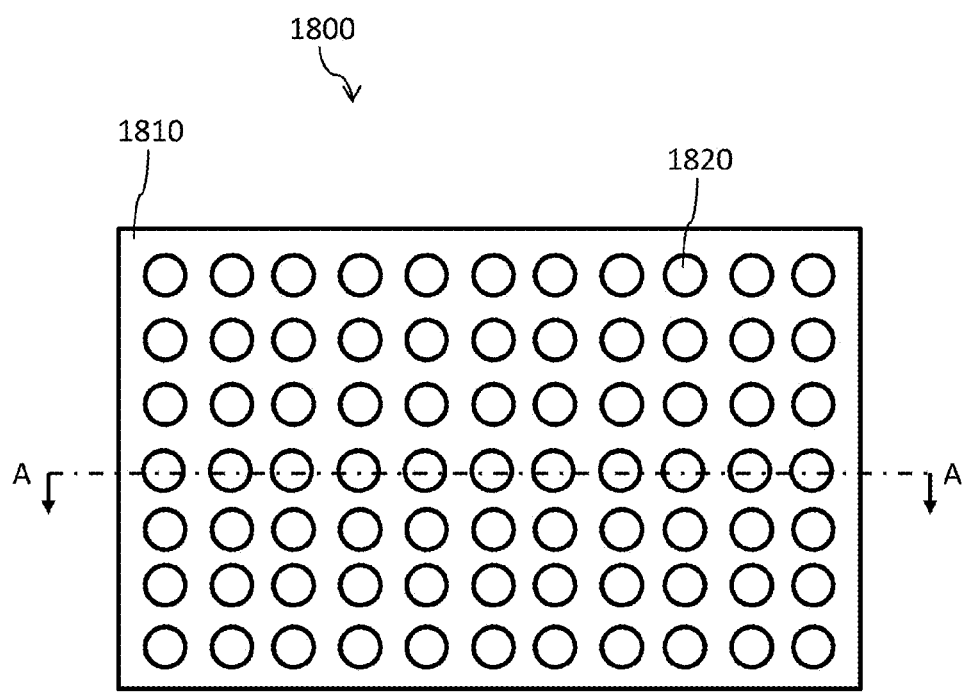
FIG. 18A is a schematic plan view of a perforated screen for patterning graphite sheet material.
Figure 18B:
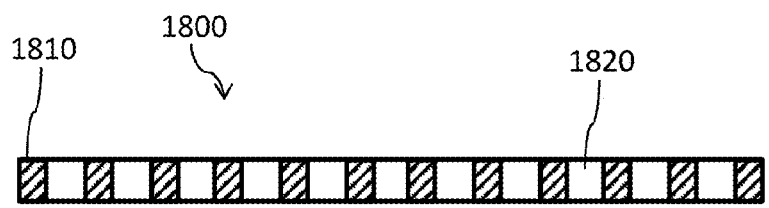
FIG. 18B is a cross-sectional view of the perforated screen of FIG. 18A.

FIG. 18A shows a schematic plan view of perforated screen 1800 that can be used to pattern graphite sheet material with a pattern of protruding buttons. Screen 1800 includes sheet material 1810 and an array of circular perforations 1820. FIG. 18B shows a schematic cross-sectional view of screen 1800 (along line A-A of FIG. 18A). Screen can be made from, among other materials, steel and in some embodiments is about 0.4-0.5 mm thick. In some embodiments the perforations are about 1 mm in diameter. In some embodiments the perforations are smaller than 1 mm in diameter.

Figure 19A:
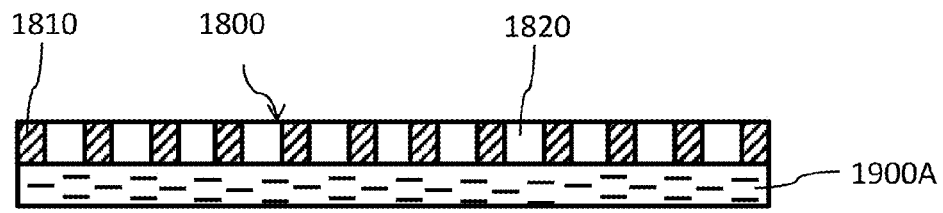
FIGS. 19A-D are schematic diagrams showing a process for changing flake orientation in a graphite sheet material using the screen of FIGS. 18A and 18B.
Figure 19B:
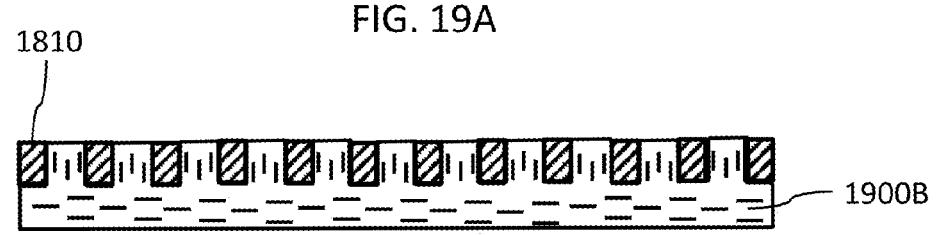
Figure 19C:

FIGS. 19A-D show how screen 1800 of FIG. 18A can be used to pattern a sheet of graphite material and increased its through-plane thermal conductivity. FIG. 19A shows screen 1800 on top of a sheet of un-patterned anisotropic graphite material 1900A. FIG. 19B shows screen 1800 pressed down on the graphite sheet material so that graphite flakes are squeezed into perforations 1820 to form a patterned graphite sheet 1900B. Flakes in the graphite material in and around the perforations tend to become oriented perpendicular to the plane of the material. FIG. 19C shows patterned graphite sheet material 1900B with the screen removed.

Figure 19D:

Graphite material that has been patterned to increase its through-plane conductivity can be used as-is or it can be further compressed, for example, using a smooth roller or die, so that the surface(s) are essentially flat or smooth. It has been found that with this approach the material retains some increased perpendicular orientation of graphite flakes that resulted from the patterning FIG. 19D is a schematic illustration showing graphite sheet material 1900C obtained by further compressing patterned material 1900B with a flat roller or die.

Using this approach of patterning and then flattening conventional graphite sheet materials, through-plane conductivities of about 15-18 W/mK have been obtained. This compares to through-plane conductivities of about 3-4 W/mK for conventional un-patterned graphite sheet material. It is generally more convenient to take commercially available sheet material and pattern it as described above, rather than using a blending and compression process, as described for example in reference to FIG. 14. However, by blending the graphite particles or flakes, forming a sheet material and then patterning, it is expected that very high through-plane conductivity, for example exceeding 40 W/mK, can be achieved.

Figure 20A:
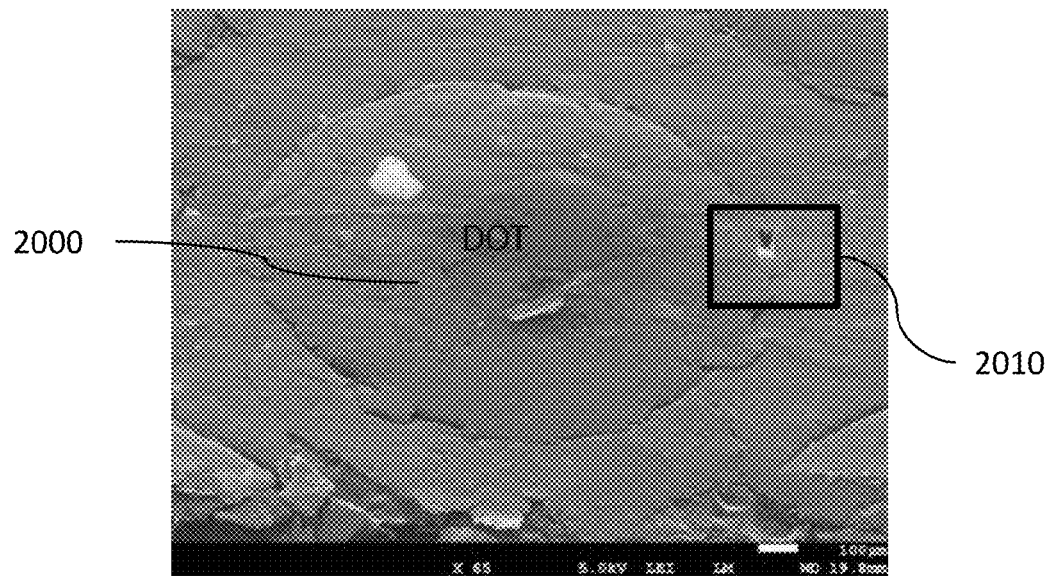
FIGS. 20A-C are scanning electron microscope images of graphite sheet material that was patterned and then compressed with a flat die.
Figure 20B:
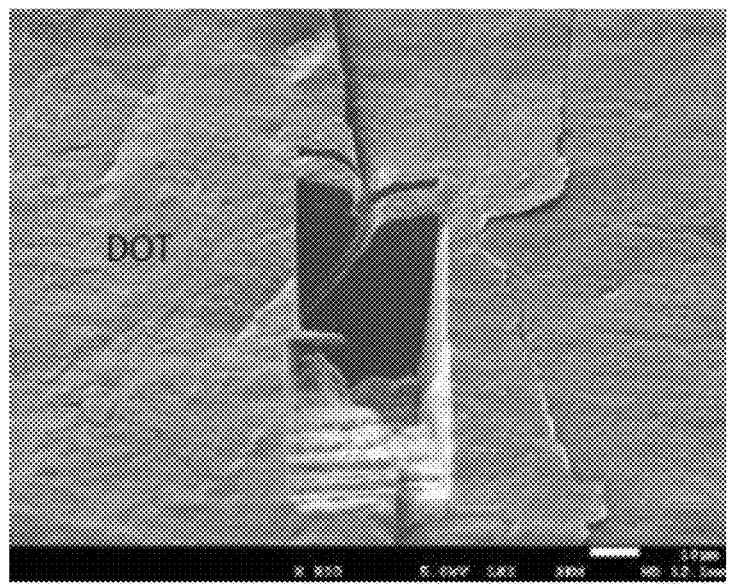
Figure 20C:
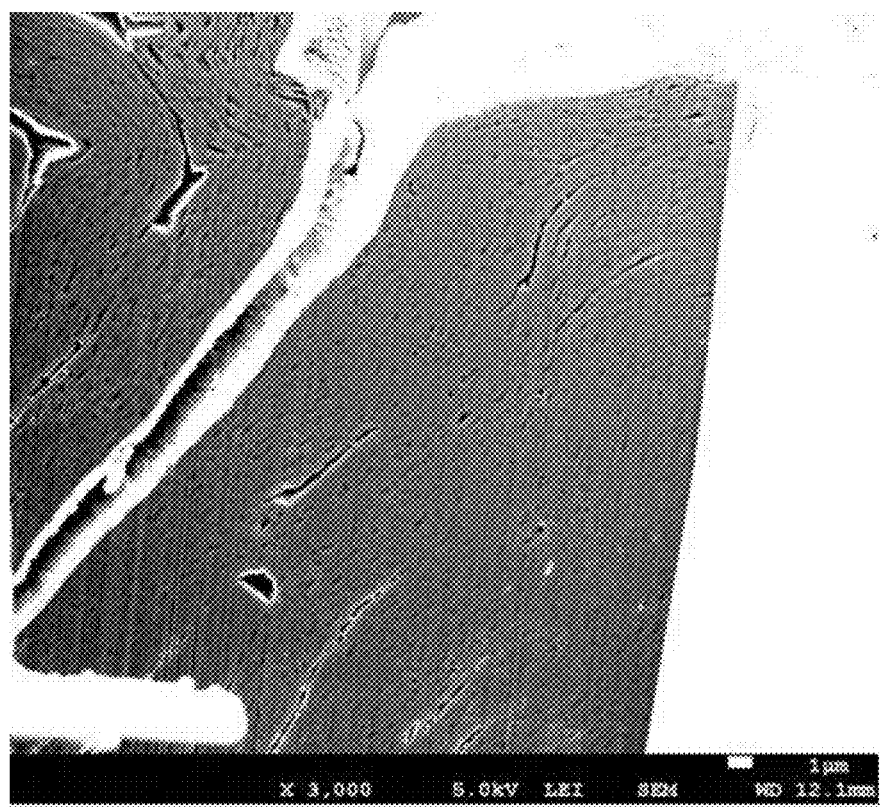

FIGS. 20A-C show scanning electron microscope images of a graphite sheet material that was patterned with a protruding button or dot pattern and was then compressed with a flat die. FIG. 20A (65 times magnification) shows one of the button features 2000 still visible at the surface after the material has been compressed with a flat die. Cross-section of portion 2010 straddling the button interface was prepared using a focussed ion beam. This sectioning technique caused little or no disruption to the graphite flakes in the sample. FIG. 20B shows a scanning electron microscope image (800 times magnification) of cross-section 2010. FIG. 20C shows a higher magnification image (3000 times magnification) of a portion of cross-section 2010 shown in FIG. 20B. The orientation of the graphite flakes at the interface is clearly visible. FIG. 20C shows that the orientation of the flakes is almost perpendicular to the plane of the material, confirming that the patterning has resulted in increased alignment of the flakes perpendicular to the plane of the material.

Through-Plane Thermal Resistance

Thermal resistance is defined as the opposition a material presents to the flow of heat. The in-plane and through-plane thermal resistance can be indicative of the thermal anisotropy of flexible graphite.

Thermal properties of material can be measured with a variety of equipment. Common approaches for measuring thermal properties in the in-plane and through-plane directions include a laser flash method, a hot wire method, an ASTM D5470 method and combinations of the above methods. ASTM D5470 is a Standard Test Method for Thermal Transmission Properties of Thermally Conductive Electrical Insulation Materials and can be used to determine thermal resistance. The method involves placing the material to be tested between a hot surface and a cold surface, and measuring the heat flow.

Figure 21:
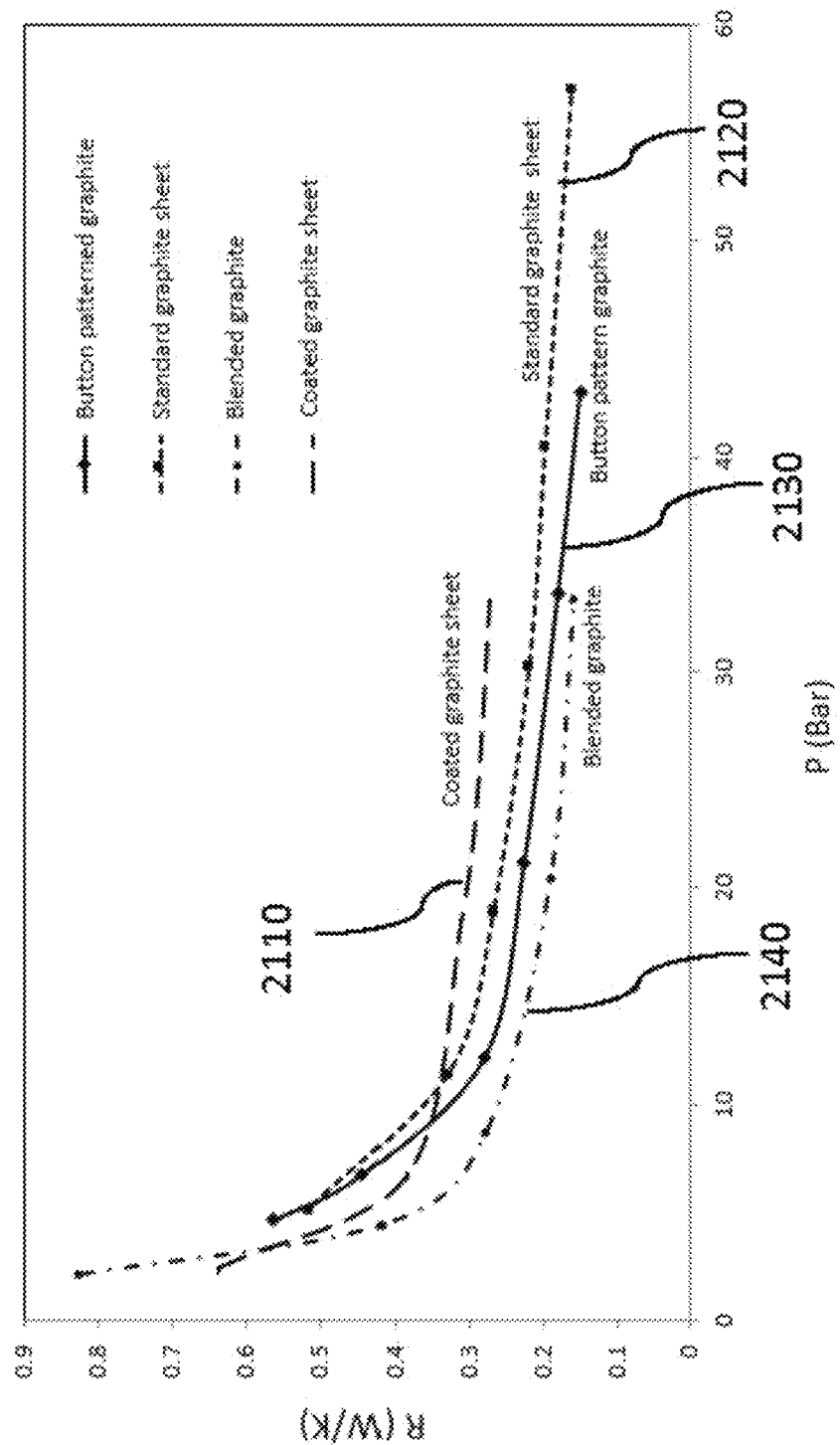
FIG. 21 is a graph showing measurements of through-plane thermal resistance for four different graphite sheet materials.

FIG. 21 is a graph showing measurements of through-plane thermal resistance for four samples of different graphite sheets. Thermal resistance R is plotted as a function of pressure P for each of the materials as lines 2110 through 2140. Line 2110 labeled "coated graphite sheet" shows the behavior of the thermal resistance for a commercially available coated graphite sheet with a sheet thickness of 0.017 mm and a density of 2.10 g/cm$^3$. Line 2120 labeled "standard graphite sheet" shows the behavior of the thermal resistance for a commercially available coated graphite sheet with a sheet thickness of 0.48 mm and a density of 1.81 g/cm$^3$.

Line 2130 labeled "blended graphite" shows the behavior of thermal resistance for flexible graphite with a thickness of 0.42 mm and a density of 1.83 g/cm$^3$, produced by the system and method described herein in which the graphite is produced according to method 1400 of FIG. 14 without optional step 1470. The graphite is blended and compacted to the desired thickness, and the orientation of the graphite flakes is largely random in the resulting flexible graphite sheet. In other words, the graphite flakes show no significant preference for either in-plane or through-plane orientation.

Line 2140 labeled "Buttoned pattern graphite" shows the behavior of thermal resistance for flexible graphite with a thickness of 0.42 mm and a density of 1.9 g/cm$^3$, produced by the system and method described herein in which the graphite is produced according to method 1400 of FIG. 14 without including optional step 1470. Patterning was accomplished by positioning an insert at the base of the die cavity. In the case of the line 2140 of FIG. 21, the insert was configured to achieve similar patterning on the graphite sheet as the button die shown in FIG. 8C, for example. The graphite flakes in the resulting graphite sheet show a preference for through-plane orientation.

The thermal resistance 2120 for the commercially available uncoated graphite sheet provides a baseline value. FIG. 21 shows that the systems and methods described herein result can provide flexible graphite sheet material having lower thermal resistance than commercially available materials.

Thus, the systems and methods described above can be used to manipulate the orientation of graphite flakes to produce flexible graphite with greater through-plane thermal conductivity which can be beneficial in some applications such as use as thermal interface materials Thermal Interface Material A thermal interface material (also known as a TIM) is a thermally conductive material that is commonly used to transfer heat from a heat source to a heat sink. Generally is it desirable that a TIM can transport high heat flux, and provide excellent contact between the surfaces, for example so that it fills voids or irregularities between a heat source (or mount thereof) and a heat sink and/or between and heat spreader and a heat sink. Often pastes, greases and films are used as TIMS, but they generally have poor electrical conductivity.

Flexible graphite sheet materials produced by the system and methods described above can be used as TIMs. Such materials can provider through-plane thermal conductivity that is an order of magnitude greater than commonly used TIMs, and that is significantly (for example, 3-5 times) greater than conventional graphite sheet materials. Some embodiments of the materials described herein have been found to have though-plane conductivities of greater than 20 W/mK. Some embodiments of the materials described herein have been found to have though-plane conductivities of greater than 25 W/mK. For some example, though-plane conductivities of at least 30 W/mK have been achieved. Embodiments of the graphite sheet materials described herein can conform well to the surface(s) with which they are in contact. Graphite offers other advantages over conventional TIMs including reduced cost, low thermal expansion, not being susceptible to corrosion and low material creep.

Figure 22A:
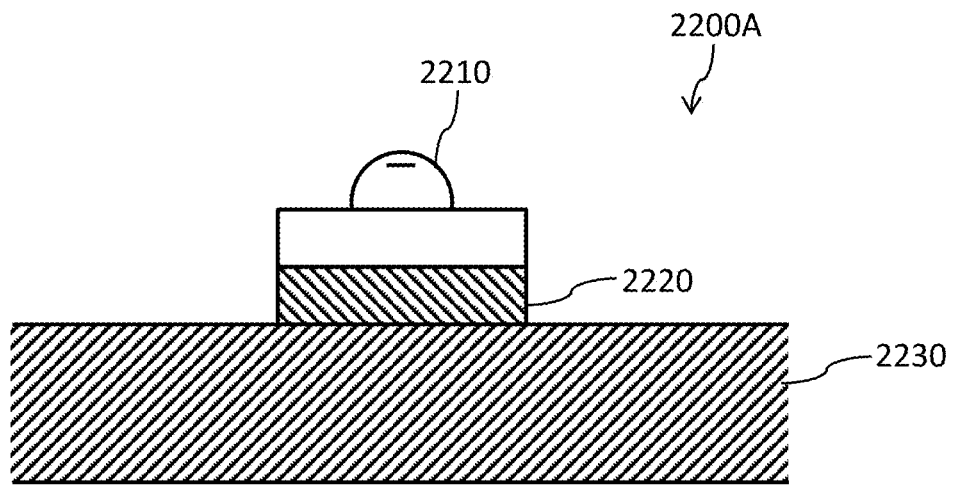
FIG. 22A (PRIOR ART) is a schematic diagram showing a cross-section of an apparatus comprising an LED and a first mechanism for heat removal.

FIG. 22A (PRIOR ART) is a schematic diagram showing a cross-section of apparatus 2200A comprising LED 2210 and a conventional mechanism for heat removal.

The conventional mechanism for heat removal includes thermal interface material (TIM) 2220 and copper heat spreader 2230. Heat is conducted away from LED 2210 through TIM 2220 to copper heat spreader 2230.

Figure 22B:
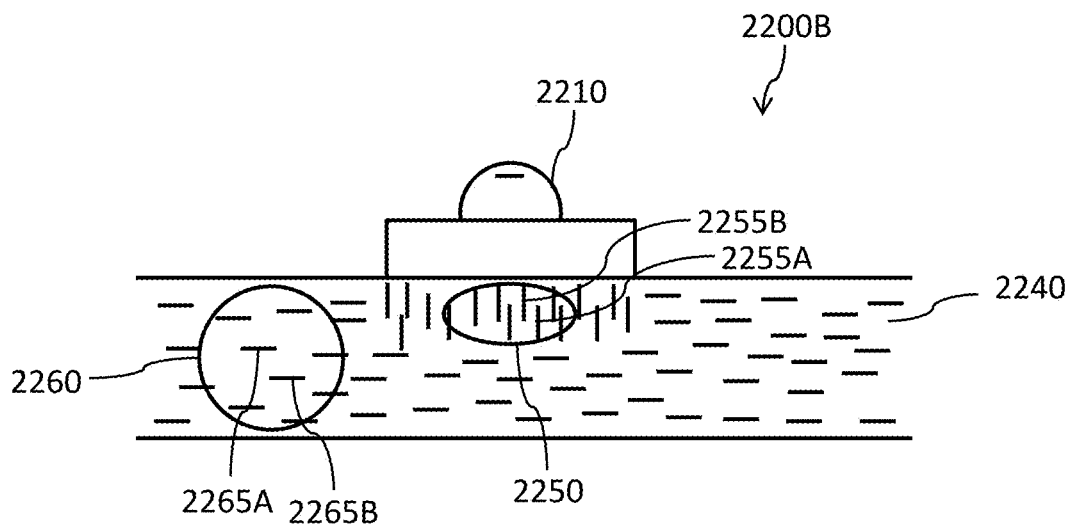
FIG. 22B is a schematic diagram showing a cross-section of an apparatus comprising an LED and a second mechanism for heat removal.

FIG. 22B is a schematic diagram showing a cross-section of apparatus 2200B comprising LED 2210 and a novel mechanism for heat removal. The novel mechanism for heat removal includes a single sheet of flexible graphite 2240.

Flexible graphite sheet 2240 includes two or more regions with different directional thermal properties. Region 2250, typically located under and adjacent to LED 2210, has graphite flakes in a preferred orientation perpendicular to the plane of the material such as flakes 2255A and 2255B. Region 2260 typically occupying the bulk of flexible graphite sheet 2240, and surrounding one or more regions such as region 2250, has graphite flakes in a preferred horizontal orientation such as flakes 2265A and 2265B. In an alternative embodiment, region 2260 comprises graphite flakes in an essentially random orientation.

The two or more regions of flexible graphite sheet 2240 having different directional thermal properties are integrated as shown in FIG. 22B.

In an alternative embodiment, flexible graphite sheet 2240 can comprise separate pieces having different directional thermal properties, and bonded or laminated together to form a single heat removal mechanism.

Flexible graphite sheet 2240 can be produced by the technology described herein, for example by one or more of methods 300 and 1400 of FIGS. 3 and 14, or a suitable combination of the above methods.

In one approach, flexible graphite sheet 2240 can be produced by placing a sheet of flexible graphite in a die cavity (such as cavity 1515 of die 1510 of FIG. 15A), inserting a button die (such as shown in FIG. 8C), and compressing or compacting the sheet. The process causes graphite to be pushed into "pockets" in the die, the pockets containing graphite flakes with more preferential perpendicular (through-plane) orientation. In another approach, flexible graphite sheet 2240 can be produced by starting with flexible or exfoliated graphite that has been blended, for example using an industrial blender. In this context, blending refers to chopping up the exfoliated graphite into smaller particles. The blended graphite is placed in a die cavity (for example, as shown in FIG. 15A), a button die (such as shown in FIG. 8C) is inserted, and the material is compressed or compacted.

A benefit of the method described above is that heat can be transported away from the LED, first in the through-plane or vertical direction, and then in the along-plane or horizontal direction.

The integrated thermal interface material produced by the method described above, and comprising two or more regions of material with configurable thermal anisotropy, is suitable for a variety of applications including, but not limited to, heat removal from luminaires and power rectifiers.

Heat Sinks

Formable graphite-based heat sinks are three-dimensional structures formed from graphite material that is flexible and can be folded and shaped. By three-dimensional structures, it is meant that the structures are not simply sheet or flat plate configurations of graphite-based materials, such as might be used in heat spreaders or as TIMs. The heat sinks described herein include structures with multiple features (such as ribbing or raised dots) and can efficiently dissipate heat from a surface being cooled.

Heat sinks can be manufactured from expanded graphite sheet material that has been compressed to a higher density, and is formable and foldable, without the need to impregnate with a resin. Although resin can be added, embodiments of the technology described herein achieve a high enough density and have mechanical and thermal properties suitable for heat sink and heat exchanger applications without the need to add resin to the expanded graphite sheet material.

Many different geometries are possible using folding and shaping of the flexible graphite sheet material. For example, the material can be made into flexible strips. In other examples, materials with different densities can be used in combination such as a densified graphite substrate with flexible ribbon graphite and densified heat sink fins. The heat sinks and other devices described herein can be substantially, if not entirely, graphite structures and are different from conventional heat sinks and other devices that employ a combination of graphite and metal in their construction. In some examples, the material (or a single component made from the material) can be used to provide more than one function at the same time.

Figure 23A:
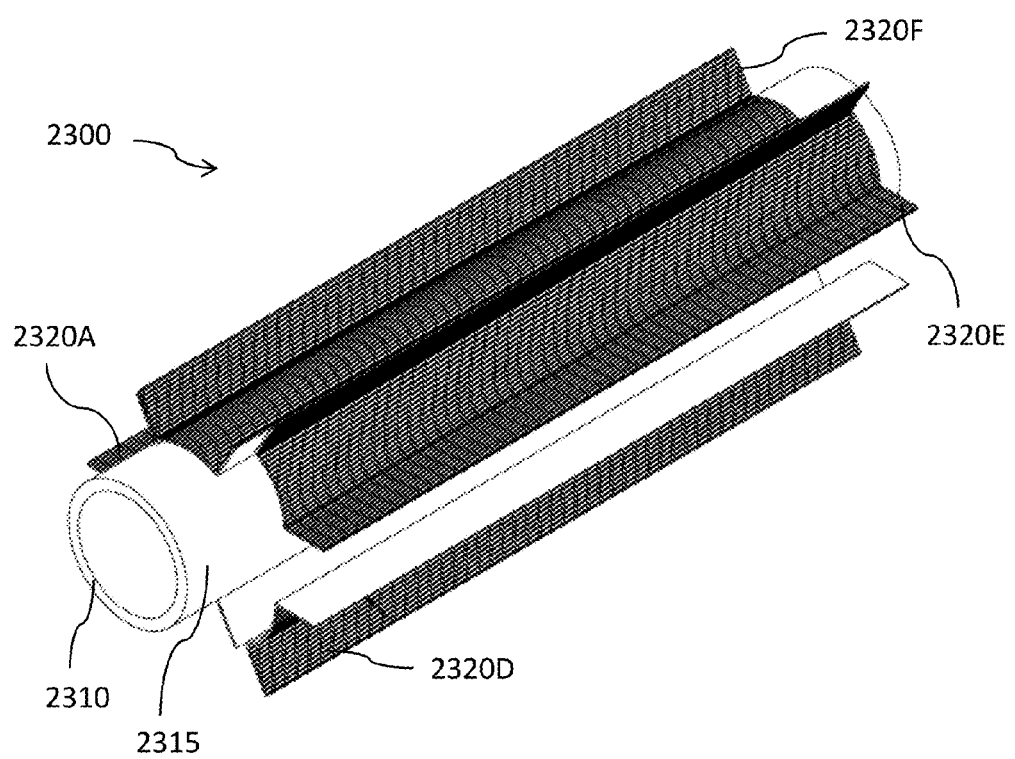
FIG. 23A is an isometric view of a heat sink assembly in which folded, three-dimensional subassemblies are attached to the outer surface of a pipe.
Figure 23B:
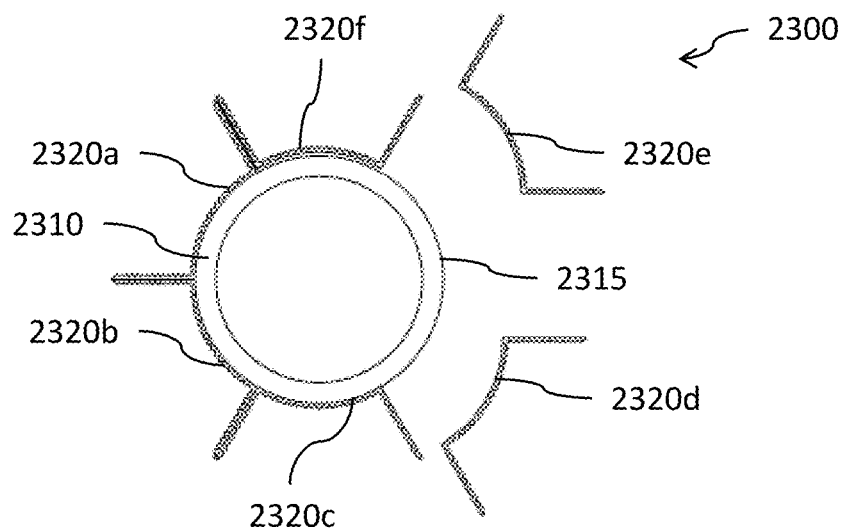
FIG. 23B is a cross-sectional slice taken through the heat sink assembly shown in FIG. 23A.
Figure 23C:
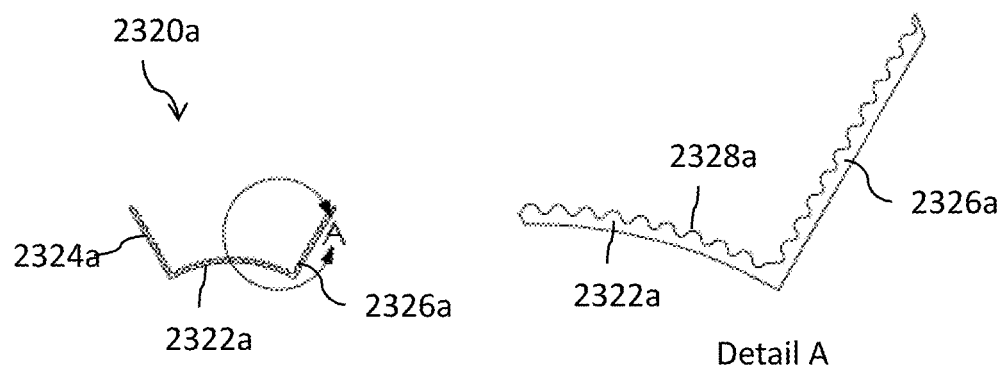
FIG. 23C shows the details of one of the folded subassemblies shown in FIGS. 23A and 23B.

FIGS. 23A through 23C illustrate folded, shaped, three-dimensional heat sink assembly 2300 attached to pipe 2310. As shown in FIG. 23A, heat sink assembly 2300 includes subassemblies 2320A, 2320D, 2320E and 2320F attached to outer surface 2315 of pipe 2310.

FIG. 23B shows a cross-sectional slice taken through heat sink assembly 2300, which includes six subassemblies 2320a through 2320f. Subassemblies 2320a through 2320f are configured to attach to pipe 2310 and to cover substantially all of outer surface 2315 along a length of pipe 2310. In some embodiments, subassemblies 2320a through 2320f do not cover all of outer surface 2315, Subassemblies 2320a through 2320f are folded and shaped.

FIG. 23C shows a detail of subassembly 2320a. Subassembly 2320a has base 2322a and sides 2324a and 2326a. Base 2322a is shaped to fit the contour of pipe 2310. Sides 2324a and 2326a are created by folding the material. Sides 2324a and 2326a through 2324f and 2326f are configured to form six fins. The outside of subassembly 2320a (the side furthest from pipe 2310) is embossed to form a plurality of ribs such as 2328a that run the length of subassembly 2320a. Some or all of the surface of subassemblies 2320a through 2320f of FIG. 23B can include a coating layer as described in further detail below.

The heat sink assemblies illustrated in the preceding figures can be readily manufactured from resin-free graphite sheet material that has been compressed to sufficient density and embossed with features to increase heat dissipation. Embodiments of the processed graphite material described herein can be shaped and folded, and the constituent graphite flakes aligned along a new axis to provide more efficient heat transfer in the desired direction.

Figure 24A:
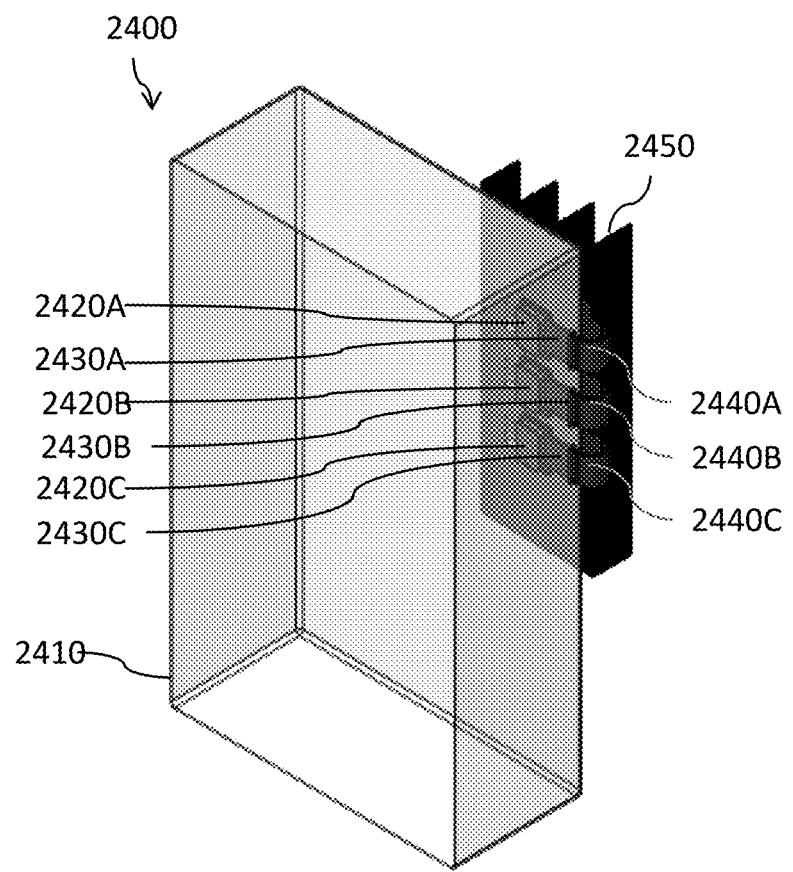
FIG. 24A is an isometric view of a heat sink assembly for dissipating heat from electronic components.

FIGS. 24A through 24D illustrate heat sink assembly 2400 for dissipating heat from electronic components 2420a through 2420c. As shown in FIG. 24B, electronic components 2420a through 2420c are contained in casing 2410. Heat sink assembly 2400 includes rigid subassemblies 2430a through 2430c, each of which is attached to electronic components 2420a through 2420c, respectively, to provide effective thermal contact. Heat sink assembly 2400 further includes flexible subassemblies 2440a through 2440c which can, for example, be manufactured from graphite ribbon. The graphite ribbon can have a different density than the graphite material used in rigid subassemblies 2430a through 2430c. Flexible subassemblies 2440a through 2440c are connected on one end to rigid subassemblies 2430a through 2430c, respectively, and on the other end to more rigid fin assembly 2450.

Heat sink assembly 2400 in FIGS. 24A through 24D is configured to conduct heat efficiently along most if not all of its three axes. Heat sink assembly 2400 can transmit heat from electronic components 2420a through 2420c (the heat sources) across rigid subassemblies 2430a through 2430c and around the bend in flexible subassemblies 2440a through 2440c to rigid fin assembly 2450.

The graphite heat sink assembly components described above can be integrated so as to remove some of the mechanical linkages between them. In some embodiments, the graphite devices can be manufactured as a single contiguous mechanical part. In other embodiments, the heat sink can be a separate part, and mechanically and thermally connected to the other integrated graphite elements. A benefit of fewer links is greater thermal efficiency.

Integrated Flexible Graphite Heat Removal Devices

As described above, graphite sheet material can be patterned in various ways in order to change its properties, including its ability to be densified, laminated, folded or shaped, as well as its in-plane and through plane thermal and electrical conductivity, and its surface area.

In an aspect of the present technology, graphite sheet material is selectively patterned in different regions to impart desirable localized properties to the material. This approach can be taken for a wide variety of end-use application and in the fabrication of a variety of devices that comprise graphite sheet material. For example, this approach can be taken in the fabrication of heat exchangers. It can also be used in the fabrication of integrated flexible graphite heat removal devices as described in further detail below. Such integrated heat removal devices can be unitary structures, for example, with essentially no thermal interfaces within the device itself. In some embodiments they are made from a single sheet of graphite material.

Separate dies can be used to pattern different regions of the material or a single die with multiple different features or patterns in different regions can be used.

Figure 25A:
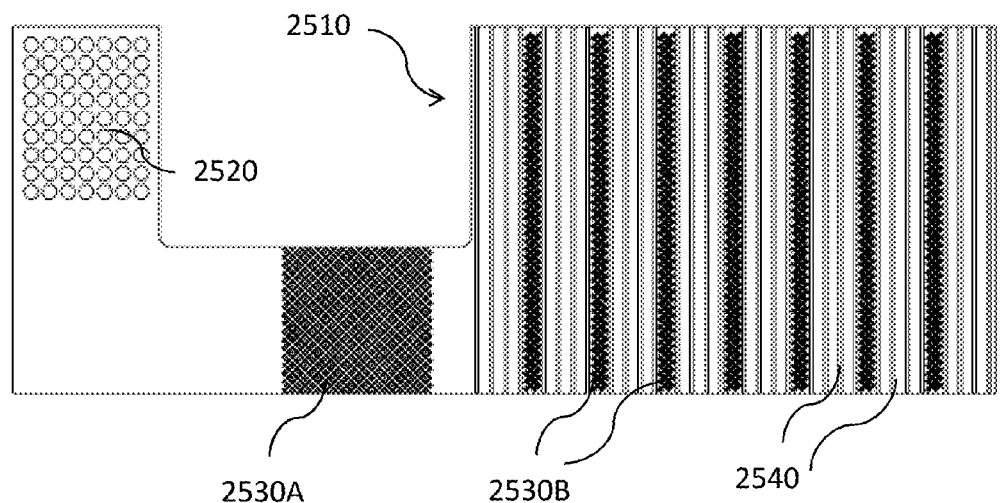
FIG. 25A shows a piece of selectively patterned graphite sheet material prior to forming into three-dimensional structure integrated heat removal device.
Figure 25B:
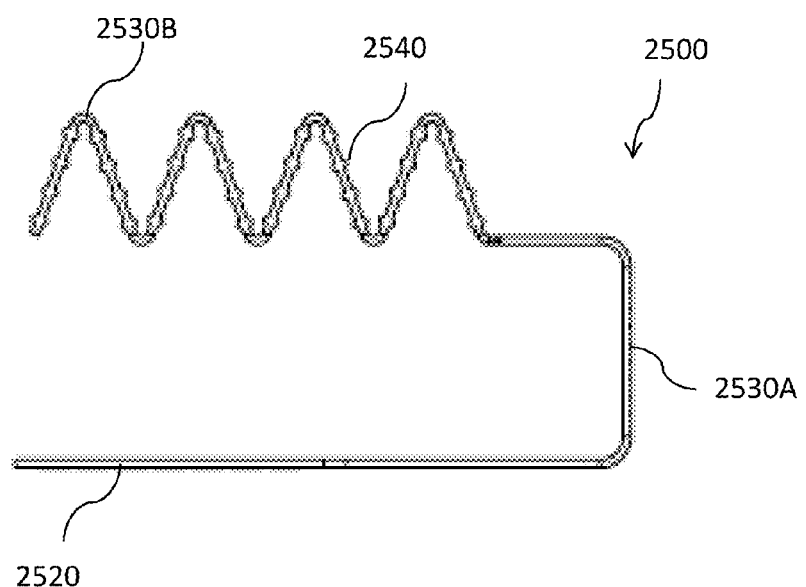
FIG. 25B is a cross-sectional view of the selectively patterned graphite sheet material of FIG. 25A formed into an integrated heat removal device.
Figure 25C:
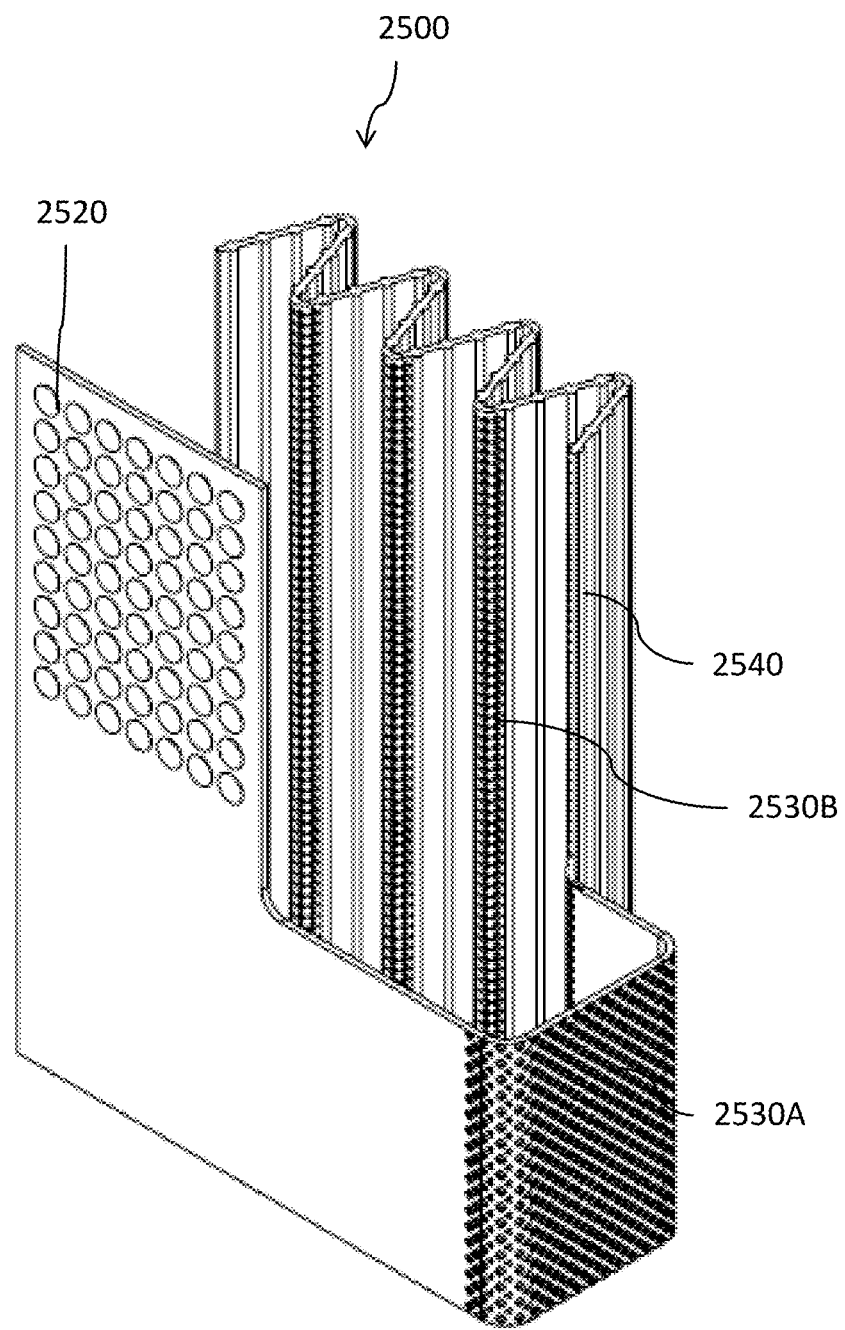
FIG. 25C is an isometric view of an embodiment of an integrated heat removal device made from the selectively patterned graphite sheet material of FIG. 25A.

FIGS. 25A-C illustrate how integrated heat removal device 2500 can be made from a single sheet of flexible graphite material that is selectively patterned in different ways in different regions to impart desirable localized properties to the device. FIG. 25A shows a piece of graphite sheet material 2510 cut to shape and patterned (for example using a patterned die in a compression press), prior to forming or folding into three-dimensional structure 2500. Region 2520 is patterned with a button pattern of protruding buttons to change the flake orientation, and enhance the through-plane thermal conductivity of the material in this particular region. This region then can be pressed flat if desired, or protruding buttons can be compressed in the end-use application, for example, by being squeezed against a component that is to be cooled. Regions 2530 are patterned with a diamond pattern that renders the material more flexible in these regions so that it can be folded and shaped in these regions with a reduced tendency to splinter or crack. Regions 2540 are patterned with a series of ribs to increase the surface area and facilitate heat dissipation to the surrounding environment. FIG. 25B is a cross-sectional view of patterned graphite sheet material 2510 after it has been shaped. FIG. 25C is an isometric view of integrated heat removal device 2500 made by folding and forming patterned flexible graphite sheet material 2510. Region 2520 which is patterned to have higher through-plane conductivity, can be placed in contact with the heat source which is to be cooled thereby serving as a thermal interface pad. Heat then travels through other portions of integrated heat removal device 2500 to the ribbed region 2540 which in the illustrated embodiment is corrugated to form a series of channels for efficient heat removal. An enlarged view of ribbed region is shown as 2540C in FIG. 25C.

Figure 26:
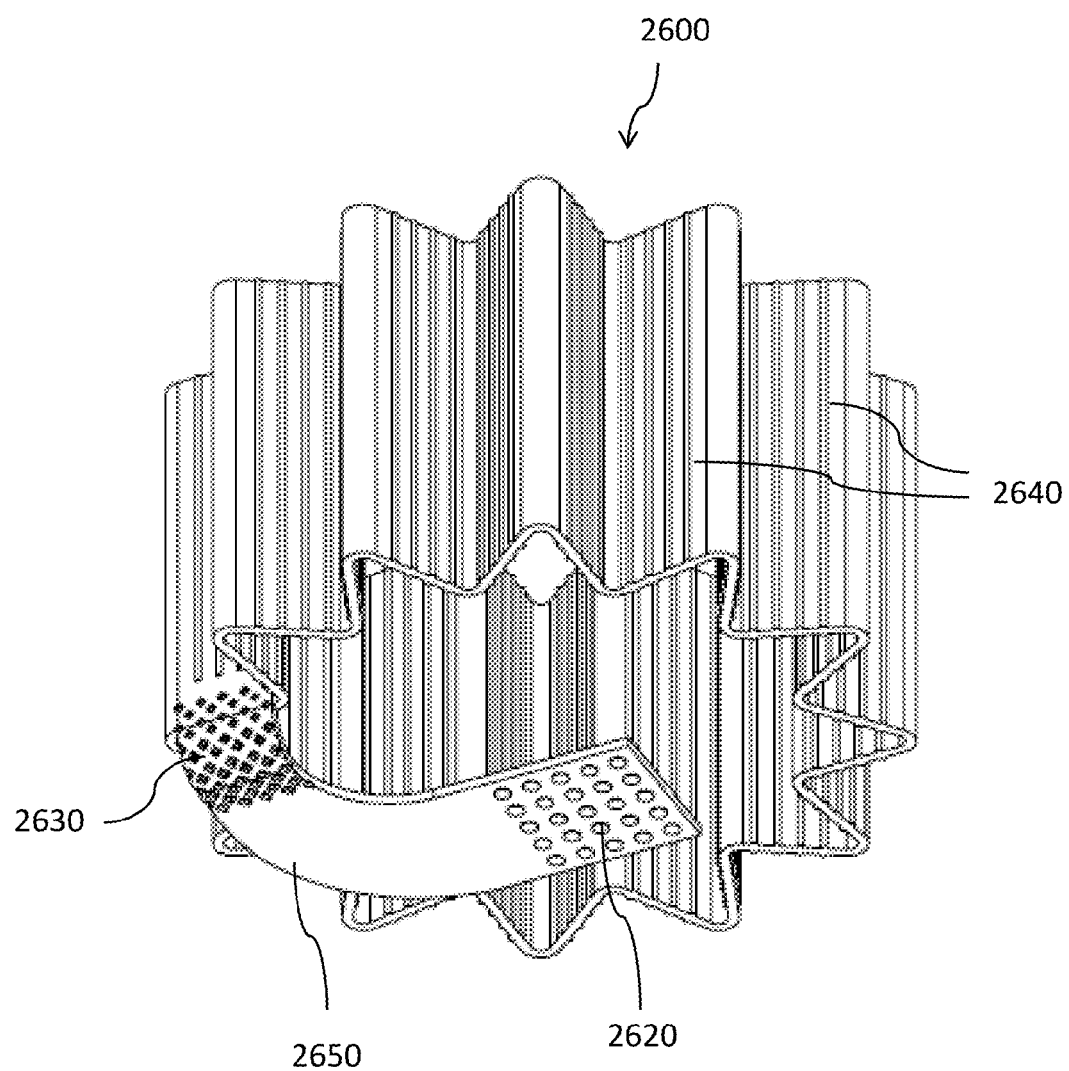
FIG. 26 is an isometric view of another embodiment of an integrated heat removal device made from selectively patterned graphite sheet material.

FIG. 26 is an isometric view illustrating another embodiment of integrated heat removal device 2600 made from a sheet of flexible graphite material that is selectively patterned in different ways in different regions to impart desirable localized properties to the device. The sheet material is cut to shape and selectively patterned, for example using a die press. Region 2620 is patterned on one or both sides with a button pattern to enhance the through-plane thermal conductivity of the material in this particular region. Region 2630 is patterned with a diamond pattern that renders the material more flexible in these regions. Most of the material is patterned on both sides with a series of ribs 2640 to increase the surface area. The integrated heat dissipation device is then formed by corrugating the graphite sheet material that has been patterned with ribs into a star-shaped heat sink. Tab 2650 having region 2620 on it is folded underneath the star-shaped heat sink as shown by folding it along patterned region 2630. Region 2620 can serve as a thermal interface pad. In some embodiments, an LED can be mounted upon either side of region 2620 and the buttons can be pressed flat. Heat can be removed efficiently via region 2620 that has higher through-plane thermal conductivity than the rest of the device, and then dissipated via the star-shaped heat sink. Device 2600 can thus be made from a single piece of material, eliminating interfaces which can otherwise hinder heat transfer. The heat sink portions of the device can be made to be attractive and decorative in shape and/or texture, as appropriate for the end-use application.

Figure 27:
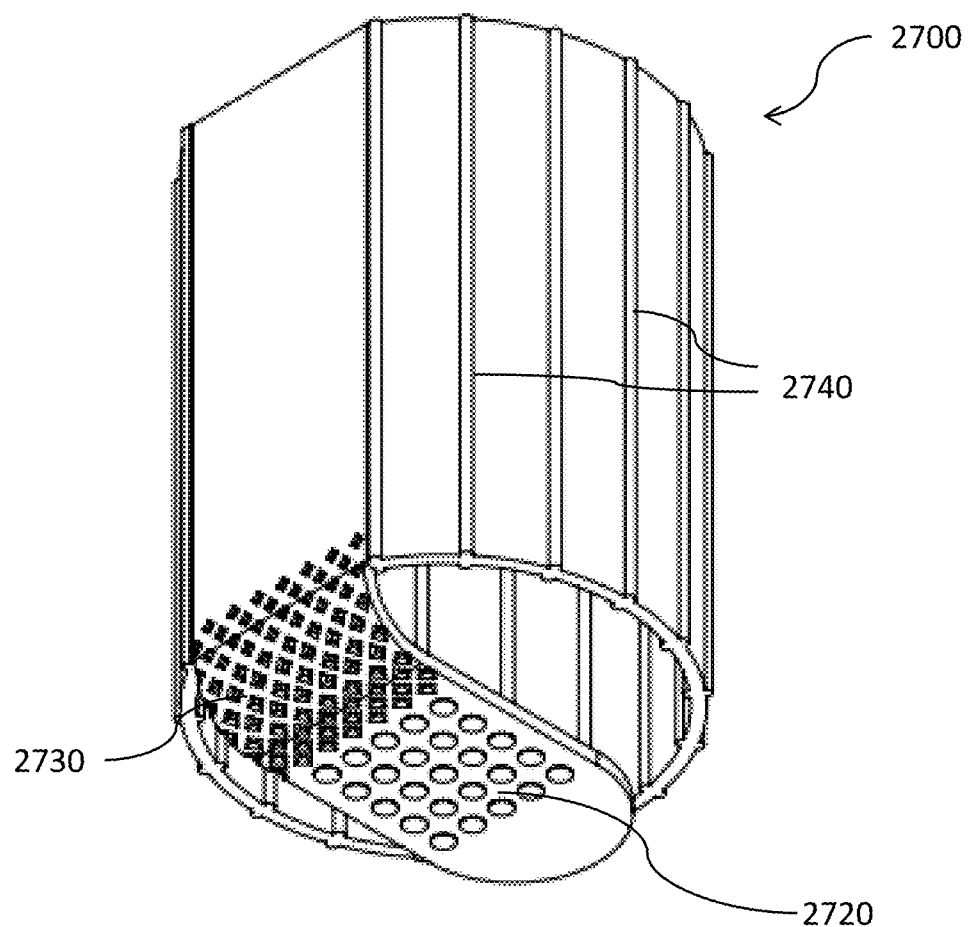
FIG. 27 is an isometric view of another embodiment of an integrated heat removal device made from selectively patterned graphite sheet material.

FIG. 27 is an isometric view illustrating a similar integrated heat removal device 2700 with thermal interface region 2720 patterned as described above to increase the through-plane thermal conductivity, flexible region 2730 patterned with a diamond pattern and a pipe-shaped heat sink portion with ribs 2740 to provide a higher surface area for heat dissipation. Again, an LED power rectifier or other suitable electronic device can be mounted on thermal interface region 2720.

Figure 28A:
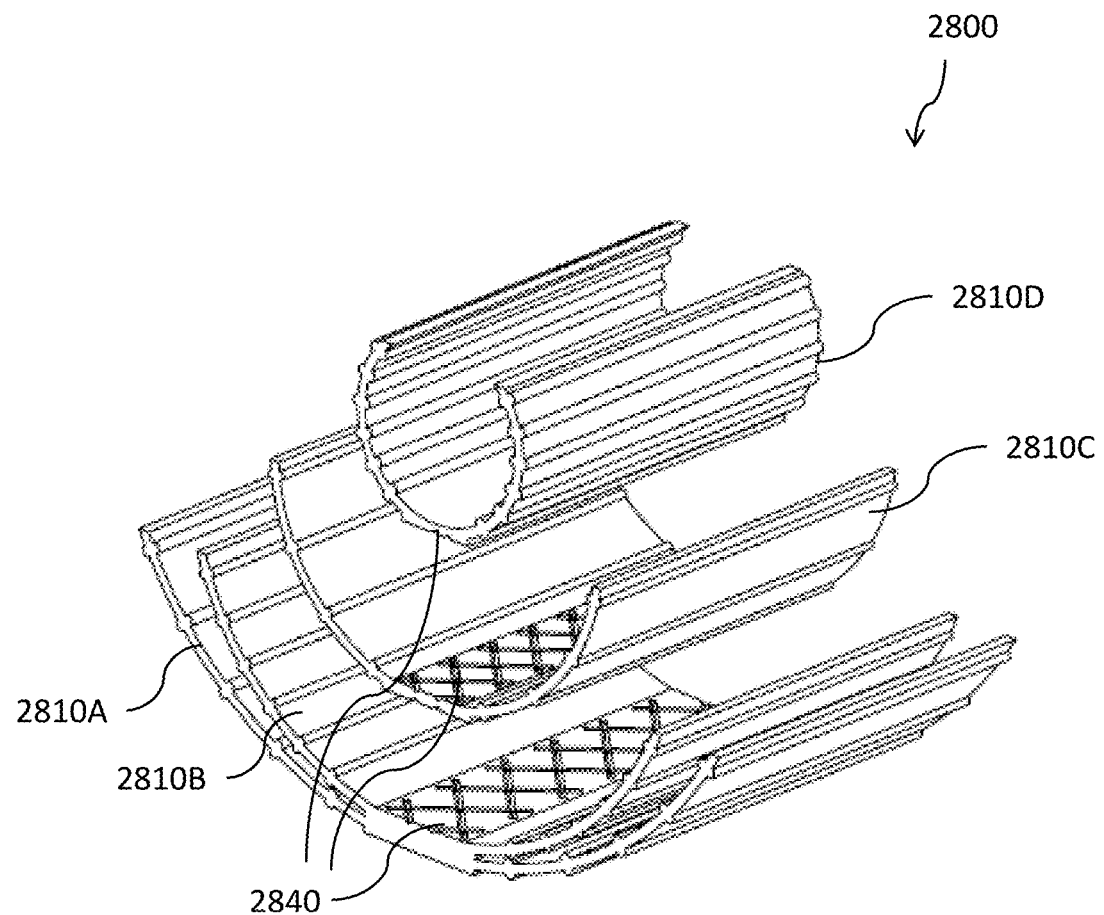
FIG. 28A is a partially exploded view showing the assembly of another embodiment of an integrated heat removal device made by laminating four pieces of selectively patterned graphite sheet material.
Figure 28B:
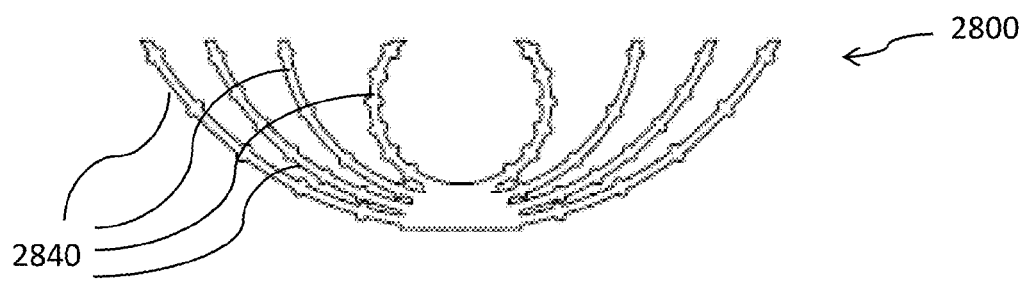
FIG. 28B is an end view of the integrated heat removal device of FIG. 28A.
Figure 28C:
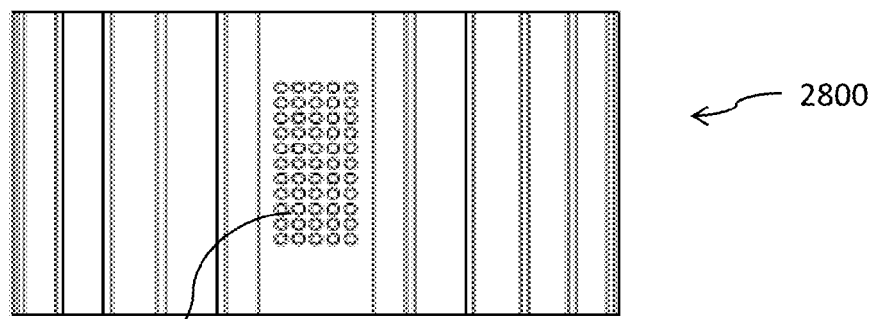
FIG. 28C is an underside view of the integrated heat removal device of FIG. 28A.
Figure 28D:
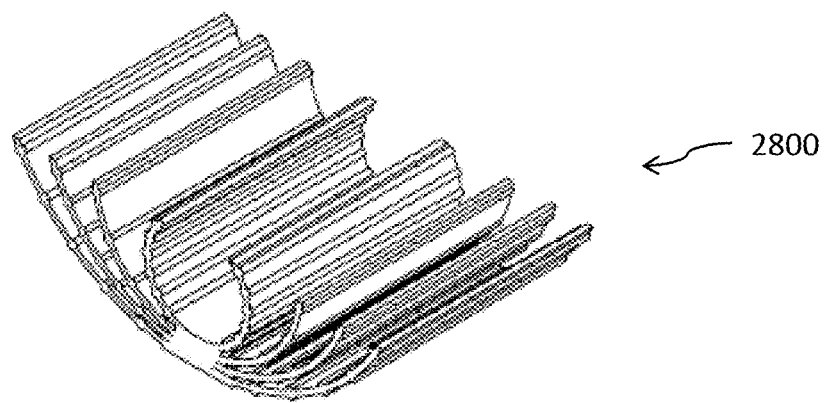
FIG. 28D is an isometric view of the integrated heat removal device of FIG. 28A.

FIG. 28A-D illustrate integrated heat removal device 2800 made by selectively patterning four pieces of flexible graphite material 2810A, 2810B, 2810C and 2810D and then laminating them together and forming them into three-dimensional structure. As shown in partially exploded view 28A, central regions 2840 of lower piece 2810A and upper piece 2810D are patterned on the upper side and under side respectively with a diamond pattern, and central region of piece 2810B and 2810C are similarly patterned on both sides. This patterning facilitates homogeneous lamination (as described above) of the four pieces when they are brought together as shown in the partially exploded view of FIG. 28A. The four pieces are laminated together into a unitary structure by compression (without the need for adhesive or other bonding or fastening mechanisms, although adhesive other bonding or fastening mechanisms can be used). FIG. 28B shows an end view, FIG. 28C shows an underside view and FIG. 28D shows and isometric view of the integrated heat removal device 2800. As visible in FIG. 28C, region 2820 is patterned with a button pattern of protruding buttons and then pressed flat (as described above) to enhance the through-plane thermal conductivity of the material in this particular region. The graphite material is shaped to form curved fins 2840 that are patterned with a series of ribs to increase the surface area and facilitate heat dissipation to the surrounding environment. A row of LEDs, for example, can be mounted directly upon region 2820 which serves as a thermal interface pad. With this approach a luminaire can be made with just one interface between the LED and the entire heat removal device that is made of graphite.

In some embodiments, integrated heat removal devices (or other devices made from graphite sheet material that is selectively patterned in different regions to impart desirable localized properties to the material) can be coated or resin impregnated after they are formed. In some cases it can be desirable to coat or resin-impregnate only a portion of the device. For example, for electronics applications the thermal interface pads or region 2520 in integrated heat removal device 2500 of FIG. 25C can be coated with a thin electrically insulating coating (as described in further detail below). It can be advantageous to resin-impregnate the ribbed fins or heat sink portions of the devices after they are formed to enhance their strength and rigidity, and/or to render them more durable and weatherproof.

Resin Impregnation

For some end-use applications, it is desirable to impregnate the graphite sheet material, or devices or components made therefrom, or portions thereof, with a resin. In some embodiments a methacrylate resin can be used. As described above, it can be desirable to impregnate graphite devices after they are formed or shaped, for example, to enhance their strength and rigidity, and/or to render them more durable and weatherproof.

Various known techniques can be used for resin impregnation. For example, a suitable resin can be prepared and a graphite part can be placed in a vessel and subjected to a vacuum. The resin can then be introduced into the vessel under vacuum. The pressure can then be increased to facilitate impregnation of the resin into the graphite part. The part can then be removed from the vessel, excess resin can be washed off and then the part can be rinsed. The resin can then be cured, for example, by heating.

Coatings

For some end-use applications, it is desirable to coat the graphite sheet material, or devices or components made therefrom, with a coating or protective layer. The coating can be selected to be thermally conductive so as not to significantly adversely affect heat flow. In electronics applications or environments, the coating can be selected to be substantially non-electrically conducting, thereby providing electrical isolation between components and preventing, or at least reducing, voltage leakages between electronic circuit components and/or the electronic system's environment. A coating can also reduce the likelihood or small particles or graphite flaking or being abraded from the surface of the component and causing short-circuits or other problems. A coating can be used to reduce the permeability of graphite materials to fluids, for example, in sealing or gasketing applications. For example, a coating can be used to inhibit hydrogen permeation and/or inhibit water/coolant absorption. A coating can be used to enhance the rigidity or durability of the graphite components. Yet another type of coating is one that provides chemical resistance.

In the power electronics industry a thin film thermal interface material (TIM) is often employed between a hot electrical device such as a power rectifier and a thermal heat sink typically made from copper or aluminum. One disadvantage of the thermal interface material is that it is generally a poor conductor of heat.

The power electronics industry often requires the power electronics to be isolated from the operator. Typically, a thin polymer film or sheet of dielectric material is placed between the power electronics device and the thermal interface material or heat sink to provide electrical isolation. While helping to electrically isolate a device, the polymer film or plastic sheet can further adversely affect thermal conductivity.

When graphite sheet material, or components made therefrom, are used for thermal management in electronics applications, preferably a coating is used that provides electrical insulation while still allowing heat to conduct from a hot surface on one side of the coating to the graphite material on the other side of the coating.

Using the technology described herein, a coating can be configured to provide suitable electrical resistance between an electrical device and a formable graphite heat sink or heat exchanger. The coating can be configured to prevent or at least deter galvanic coupling and/or electrical shorting.

Any suitable coating material can be used including, but not limited to, epoxies, silicones and urethanes, and other resins. Any suitable application method or process can be employed including, but are not limited to, sprays, chemical vapour deposition, and vacuum impregnation.

Parylene is the trade name for poly(p-xylene) polymers that can be deposited on a surface, via a chemical vapor deposition process. For some applications, parylene can be used as a moisture and dielectric barrier. Parylene C is popular owing to a number of advantages including barrier properties and cost. A coating including parylene C can be an ultra-thin coating that provides a dielectric barrier to a graphite substrate. The vapor deposition process can provide control of layer thickness. In some embodiments the film thickness can range from a few angstroms to about 75 microns.

Electrical isolation tests were performed on conventional graphite sheet materials that were coated with different thicknesses of parylene C. Samples of 0.4 mm thick graphite sheet with 10, 25 and 32 micron coating thicknesses were tested. For the 10 micron coating the breakdown voltage was about 2 kV (at 1-5 mA); for the 25 micron coating the breakdown voltage was about 10 kV (at 5 mA) and for the 32 micron coating the breakdown voltage exceeded the capability of the test method but was greater than 11.9 kV. For an uncoated sample the breakdown voltage was 32-162 V at 1-5 mA. The thermal conductivity of the coated samples was somewhat reduced compared to the uncoated samples. In one set of thermally conductivity tests an uncoated sample had a thermal conductivity of about 4.5 W/mK compared to about 0.5-1.2 W/mK for the coated samples depending on the coating thickness.

These results indicate that by using graphite materials with higher through-plane thermal conductivity prepared as described herein, and applying a thin parylene C coating, it is possible to satisfy the voltage isolation requirements for many end-use power electronics applications while still having a material that has significantly higher thermal conductivity than presently available materials. Thicker or thinner coatings can be used depending on the level of voltage isolation that is needed. The layer is typically applied substantially uniformly to all of the surface features, although it need not be applied uniformly and/or to all surfaces.

While particular elements, embodiments and applications of the present invention have been shown and described, it will be understood, that the invention is not limited thereto since modifications can be made by those skilled in the art without departing from the scope of the present disclosure, particularly in light of the foregoing teachings.

What is claimed is:

1. An integrated heat removal device comprising a selectively patterned graphite sheet material formed into a three-dimensional structure, wherein said selectively patterned graphite sheet material is patterned on at least one surface with an array of flattened protrusions in a first region of said graphite sheet material to increase a through-plane thermal conductivity of said graphite sheet material in said first region relative to a through-plane thermal conductivity in another region of said graphite sheet material,
wherein said at least one surface is substantially flat in said first region, and a proportion of graphite flakes of said first region that are oriented in a through-plane direction in the first region is greater than a proportion of graphite flakes in another region that are oriented in the through-plane direction in the another region.

2. The integrated heat removal device of claim 1, wherein said first region comprises a plurality of discrete first regions.

3. The integrated heat removal device of claim 1, wherein said at least one surface includes two opposing major surfaces, said selectively patterned graphite sheet material is patterned on said two opposing major surfaces with said array of flattened protrusions in said first region of said graphite sheet material.

4. The integrated heat removal device of claim 1, wherein said selectively patterned graphite sheet material is patterned on at least one of said at least one surface or another surface with a pattern in a second region of said graphite sheet material to increase a surface area of said graphite sheet material in said second region, wherein said pattern is different from said array of flattened protrusions.

5. The integrated heat removal device of claim 1, wherein said selectively patterned graphite sheet material is patterned on at least one of said at least one surface or another surface with a pattern in a second region of said graphite sheet material to increase a flexibility of said graphite sheet material in said second region, wherein said pattern is different from said array of flattened protrusions.

6. The integrated heat removal device of claim 1, wherein at least a portion of said integrated heat removal device is impregnated with resin.

7. The integrated heat removal device of claim 1, wherein at least a portion of said integrated heat removal device is coated with an electrically insulative coating.

8. The integrated heat removal device of claim 7, wherein said coating comprises poly(p-xylene).

9. The integrated heat removal device of claim 1, wherein said three-dimensional structure comprises at least one fin.

10. The integrated heat removal device of claim 1, further comprising an electronic heat generating component mounted upon said first region of said selectively patterned graphite sheet material.

11. A method of making an integrated heat removal device comprising:
(a) selectively patterning a graphite sheet material to form a selectively patterned graphite sheet material; and
(b) forming said selectively patterned graphite sheet material into a three-dimensional structure;
wherein said selectively patterning a graphite sheet material to form a selectively patterned graphite sheet material comprises embossing at least one surface of said graphite sheet material with an array of protrusions in a first region of said graphite sheet material and then compressing said protrusions so that said at least one surface of said graphite sheet material in said first region is substantially flat, to increase a through-plane thermal conductivity of said graphite sheet material relative to a through-plane thermal conductivity in another region of said graphite sheet material.

12. The method of claim 1, wherein said first region comprises a plurality of discrete first regions.

13. The method of claim 1, wherein said at least one surface includes two opposing major surfaces, said selectively patterning said at least one surface of said graphite sheet material to form the selectively patterned graphite sheet material comprises embossing the two opposing surfaces of said graphite sheet material with said array of protrusions in said first region of said graphite sheet material.

14. The method of claim 1, wherein said selectively patterning the graphite sheet material to form the selectively patterned graphite sheet material further comprises patterning at least one of said at least one surface or another surface of said graphite sheet material with a pattern in a second region thereof to increase a surface area of said graphite sheet material in said second region, wherein said pattern is different from said array of protrusions.

15. The method of claim 1, wherein said selectively patterning the graphite sheet material to form the selectively patterned graphite sheet material further comprises patterning at least one of said at least one surface or another surface of said graphite sheet material with a pattern in a second region thereof to increase the flexibility of said graphite sheet material in said second region, wherein said pattern is different from said array of protrusions.

16. The method of claim 1, further comprising impregnating at least a portion of said three-dimensional structure with a resin after step (b).

17. The method of claim 1, further comprising coating at least a portion of said selectively patterned graphite sheet material with an electrically insulative coating.

18. The method of claim 17, wherein said electrically insulative coating comprises poly(p-xylene).

19. The method of claim 1, wherein said forming said selectively patterned graphite sheet material into the three-dimensional structure comprises at least one of: folding, corrugating, pleating, bending, and shaping.

* * * * *